(12) United States Patent
Shin et al.

(10) Patent No.: US 11,513,645 B2
(45) Date of Patent: Nov. 29, 2022

(54) DISPLAY DEVICE

(71) Applicant: SAMSUNG DISPLAY CO., LTD., Yongin-si (KR)

(72) Inventors: Jaiku Shin, Hwaseong-si (KR); Dongjin Park, Seongnam-si (KR); Dongwoo Seo, Suwon-si (KR); Sung Chul Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 238 days.

(21) Appl. No.: 16/892,140

(22) Filed: Jun. 3, 2020

(65) Prior Publication Data
US 2020/0401275 A1 Dec. 24, 2020

(30) Foreign Application Priority Data
Jun. 24, 2019 (KR) .................. 10-2019-0075089

(51) Int. Cl.
*G06F 3/044* (2006.01)
*H01L 27/32* (2006.01)

(52) U.S. Cl.
CPC .......... *G06F 3/0445* (2019.05); *H01L 27/323* (2013.01); *G06F 2203/04102* (2013.01)

(58) Field of Classification Search
CPC combination set(s) only.
See application file for complete search history.

(56) References Cited

U.S. PATENT DOCUMENTS

| 9,678,604 B2 | 6/2017 | Lee |
| 2013/0249860 A1 | 9/2013 | Seo et al. |
| 2014/0071065 A1 | 3/2014 | Kung et al. |
| 2015/0241924 A1 | 8/2015 | Chang et al. |
| 2016/0291780 A1 | 10/2016 | Namkung |
| 2017/0315645 A1* | 11/2017 | Park .................... H01L 27/323 |
| 2018/0335679 A1 | 11/2018 | Hashimoto et al. |
| 2018/0366685 A1 | 12/2018 | Park et al. |
| 2019/0064958 A1 | 2/2019 | Liu et al. |

FOREIGN PATENT DOCUMENTS

| KR | 10-1750564 B1 | 7/2012 |
| KR | 10-2013-0107640 A | 10/2013 |
| KR | 10-1717637 B1 | 3/2017 |
| KR | 10-2018-0138235 A | 12/2018 |

* cited by examiner

*Primary Examiner* — Deeprose Subedi
(74) *Attorney, Agent, or Firm* — Lewis Roca Rothgerber Christie LLP

(57) ABSTRACT

A display device includes a display module that is foldable about first and second folding axes that are spaced apart from each other along a first direction and are extended in a second direction crossing the first direction, and a digitizer module below the display module. The digitizer module includes a plurality of first electrodes that are extended in the first direction and are arranged along the second direction, and a plurality of second electrodes that are extended in the second direction, are arranged along the first direction, and are electrically disconnected from the first electrodes. The plurality of first electrodes include a plurality of first sub-electrodes overlapped with the first folding axis and a plurality of second sub-electrodes overlapped with the second folding axis and located at a different layer from the first sub-electrodes.

24 Claims, 15 Drawing Sheets

DISPLAY DEVICE

CROSS-REFERENCE TO RELATED APPLICATIONS

This patent application claims priority to and the benefit of Korean Patent Application No. 10-2019-0075089, filed on Jun. 24, 2019 in the Korean Intellectual Property Office (KIPO), the entire content of which is hereby incorporated by reference.

BACKGROUND

1. Field

Embodiments of the present disclosure relate to a display device, and in particular, to a display device configured to reduce or prevent damage to a digitizer module.

2. Description of Related Art

Electronic products, such as a smart phone, a digital camera, a notebook computer, a navigation system, and a smart television, have a display device for displaying an image to a user. The display device generates an image and provides the image to a user through a screen.

In recent years, various display devices have been developed. An example of such a display device is a flexible display device that can be deformed to have a curved shape, folded, or rolled. The use of the flexible display device allows for improvement in portability and user convenience.

A foldable display device, which is one of the flexible display devices, can be folded about a folding axis. However, a component of the foldable display device at a folding region may be damaged by various causes when the foldable display device is folded because the folding region is changed from a flat shape to a curved shape.

SUMMARY

Aspects of some embodiments of the inventive concept are directed to a display device configured to prevent or reduce damage to a digitizer module, which is overlapped with folding regions.

According to some embodiments of the inventive concept, a display device may include a display module that is foldable about a first folding axis and a second folding axis, the first folding axis and the second folding axis being spaced apart from each other along a first direction and are extended in a second direction crossing the first direction, and a digitizer module below the display module. The digitizer module may include a plurality of first electrodes extended in the first direction and arranged along the second direction, and a plurality of second electrodes extended in the second direction and arranged along the first direction, the second electrodes being insulated from the first electrodes. The plurality of first electrodes may include a plurality of first sub-electrodes overlapped with the first folding axis and a plurality of second sub-electrodes overlapped with the second folding axis, the second sub-electrodes being at a different layer from the first sub-electrodes.

According to some embodiments of the inventive concept, a display device may include a display module that is foldable about a first folding axis and a second folding axis, the first folding axis and the second folding axis being spaced apart from each other along a first direction and extended in a second direction crossing the first direction, and a digitizer module below the display module. The digitizer module may include a plurality of first electrodes extended in the first direction and a plurality of second electrodes extended in the second direction and electrically disconnected from the first electrodes. The plurality of first electrodes may include a plurality of first sub-electrodes overlapped with the first folding axis and a plurality of second sub-electrodes overlapped with the second folding axis. The second sub-electrodes may be closer to the display module than the first sub-electrodes are.

According to some embodiments of the inventive concept, a display device may include a display module that is foldable about a first folding axis and a second folding axis, the first folding axis and the second folding axis being spaced apart from each other along a first direction and are extended in a second direction crossing the first direction, and a digitizer module below the display module. The digitizer module may include a plurality of first electrodes extended in the first direction and a plurality of second electrodes extended in the second direction and electrically disconnected from the first electrodes. The plurality of first electrodes may include a plurality of first sub-electrodes, a plurality of second sub-electrodes at a same layer as the first sub-electrodes, and a plurality of third sub-electrodes, which are overlapped with the first folding axis, are located between the first sub-electrodes and the second sub-electrodes, and are at a different layer from the first sub-electrodes.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
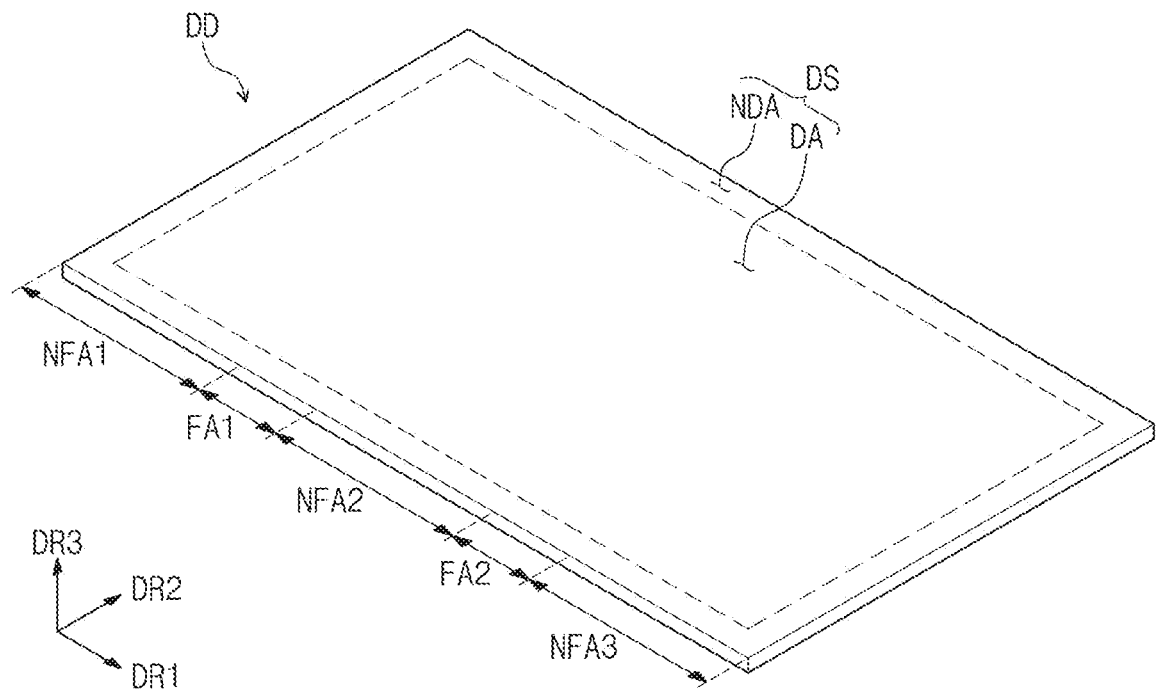
FIG. 1 is a perspective view illustrating a display device according to some embodiments of the inventive concept.

It should be noted that these figures are intended to illustrate the general characteristics of methods, structure and/or materials utilized in certain example embodiments and to supplement the written description provided below. These drawings, however, may not be drawn to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
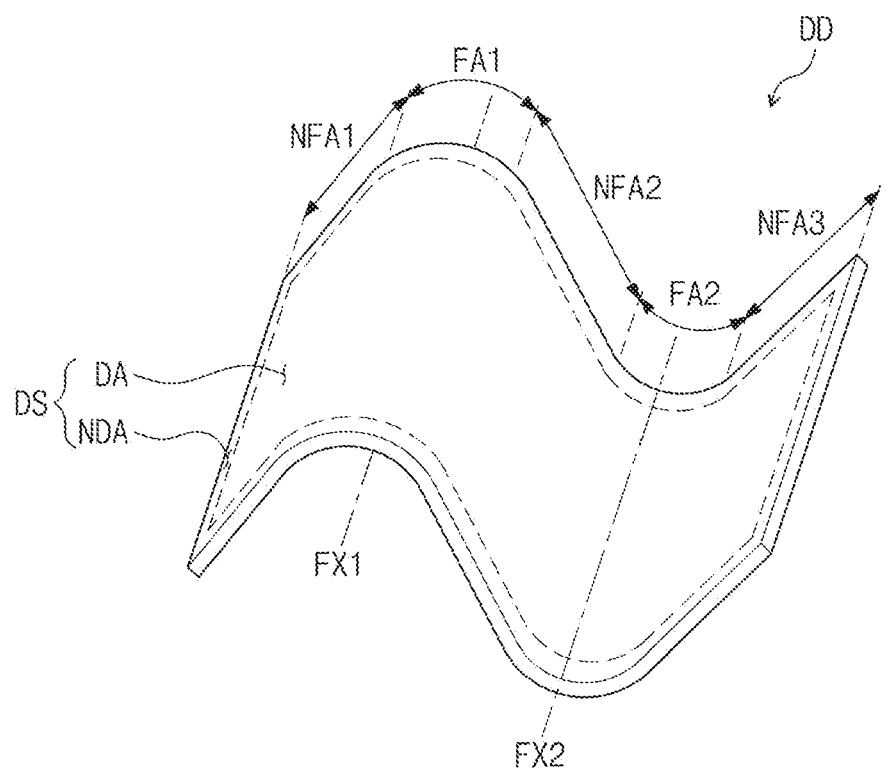
FIG. 2 is a perspective view illustrating a folded state of the display device of FIG. 1.

FIG. 1 is a perspective view illustrating a display device according to some embodiments of the inventive concept. FIG. 2 is a perspective view illustrating a folded state of the display device of FIG. 1.

Referring to FIG. 1, a display device DD may have a rectangular or tetragonal shape, whose long sides are parallel to a first direction DR1 and whose short sides are parallel to a second direction DR2 crossing the first direction DR1. However, the inventive concept is not limited to this example, and in some embodiments, the display device DD may have various suitable shapes including shapes that are not rectangular or tetragonal.

Hereinafter, a direction perpendicular to or normal to both of the first and second directions DR1 and DR2 will be referred to as a third direction DR3. Furthermore, in the present specification, the expression "when viewed in a plan view" may refer to a relevant structure that is seen in the third direction DR3 or a direction opposite the third direction DR3. In other words, "when viewed in a plan view" may refer to a top-down view, or any view from right over or a direction normal to a display surface of the display device DD.

The display device DD may include a plurality of non-folding regions NFA1, NFA2, and NFA3 and a plurality of folding regions FA1 and FA2. The folding regions FA1 and FA2 may be disposed between the non-folding regions NFA1, NFA2, and NFA3, and the non-folding regions NFA1, NFA2, and NFA3 and the folding regions FA1 and FA2 may be arranged along the first direction DR1.

The non-folding regions NFA1, NFA2, and NFA3 may include a first non-folding region NFA1, a second non-folding region NFA2, and a third non-folding region NFA3, which are sequentially arranged along the first direction DR1. The folding regions FA1 and FA2 may include a first folding region FA1, which is disposed between the first non-folding region NFA1 and the second non-folding region NFA2, and a second folding region FA2, which is disposed between the second non-folding region NFA2 and the third non-folding region NFA3. In other words, the folding regions FA1 and FA2 may be alternately arranged with the non-folding regions NFA1, NFA2, and NFA3. In some embodiments, each of the folding regions FA1 and FA2 is between two non-folding regions at opposing boundaries (or edges) of the folding regions.

Although three non-folding regions NFA1, NFA2, and NFA3 and two folding regions FA1 and FA2 are illustrated as an example, the inventive concept is not limited to this example. For example, in some embodiments, the display device DD may include four or more non-folding regions and three or more folding regions. In other embodiments, the number of folding regions and non-folding regions may be different. For example, the number of folding regions may be less than or equal to the number of non-folding regions.

A top surface of the display device DD may be defined as a display surface DS and may be a flat surface defined by the first direction DR1 and the second direction DR2. The display surface DS may include a display region DA and a non-display region NDA near or around (e.g., around the periphery of) the display region DA. The display region DA may be used to display an image, and the non-display region NDA may not be used to display an image. The non-display region NDA may enclose (e.g., encircle or surround) the display region DA and may define an edge (e.g., a periphery) of the display device DD that is printed with a set (e.g., predetermined) color.

Referring to FIG. 2, the display device DD may be a flexible display device. The display device DD may be a foldable display device that can be folded and unfolded. At least one of the first and second folding regions FA1 and FA2 may have a curved shape, when the display device DD is folded. In some embodiments, the non-folding regions NFA1, NFA2, and NFA3 may have a substantially flat or flat shape when the display device DD is folded.

The first folding region FA1 may be overlapped with a first folding axis FX1, and the second folding region FA2 may be overlapped with a second folding axis FX2. The first folding axis FX1 and the second folding axis FX2 may be extended in the second direction DR2 and may be spaced apart from each other along the first direction DR1. In some embodiments, the first folding axis FX1 is at a center of the first folding region FA1 and the second folding axis FX2 is at a center of the second folding region FA2.

The display device DD may be folded along (e.g., about or with respect to) the first folding axis FX1 and the second folding axis FX2. Due to this folding manner, the display device DD may be defined as a multi-folding display device (i.e., a device having more than one folding axis). In some embodiments, the display device DD may be folded in different directions on the first folding axis FX1 and the second folding axis FX2.

The first folding region FA1 may be folded along the first folding axis FX1. A portion of the top surface of the display device DD (e.g., a top surface of the first folding region FA1) may be convexly curved, and another portion (e.g., a bottom surface of the first folding region FA1 opposite to the top surface of the first folding region FA1) may be concavely curved. In the case where the display surface DS (i.e., the top surface of the display device DD) is convexly curved, the display device DD may be referred to as being in an out-folding state.

The second folding region FA2 may be folded along the second folding axis FX2. A portion of the top surface of the display device DD (e.g., a top surface of the second folding region FA2) may be concavely curved and another portion (e.g., a bottom surface of the second folding region FA2 opposite to the top surface of the second folding region FA2) may be convexly curved. In the case where the top surface of the display device DD is concavely curved, the display device DD may be referred to as being in an in-folding state.

In some embodiments, the first folding region FA1 may be folded to be in an out-folding state, and the second folding region FA2 may be folded to be in an in-folding state. The first non-folding region NFA1, the second non-folding region NFA2, and the third non-folding region NFA3 may be maintained to be in a substantially flat or flat state. In some embodiments, both the first and second folding regions FA1 and FA2 both may be convexly curved or concavely curved with respect to the respective folding axes FX1 and FX2.

Figure 3:
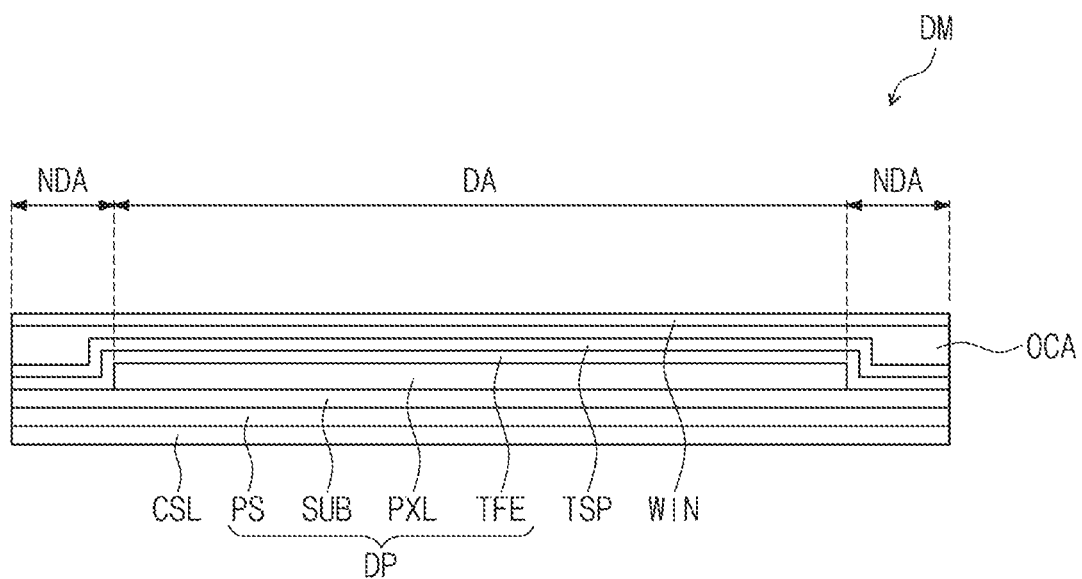
FIG. 3 is a sectional view schematically illustrating a display module of a display device according to some embodiments of the inventive concept.

FIG. 3 is a sectional view schematically illustrating a display module of a display device according to some embodiments of the inventive concept.

Referring to FIG. 3, a display module DM may include a display panel DP, a touch sensing part TSP disposed on the display panel DP, a window WIN disposed on the touch sensing part TSP, an adhesive agent OCA disposed between the touch sensing part TSP and the window WIN in the third direction DR3, and a cushion layer CSL disposed below (e.g., attached to or coupled to) the display panel DP.

In some embodiments, the display panel DP may be a light-emitting type display panel, but the inventive concept is not limited to a specific type of the display panel DP. For example, the display panel DP may be an organic light emitting display panel or a quantum dot light emitting display panel. An emission layer of the organic light emitting display panel may be formed of or include an organic luminescent material. An emission layer of the quantum dot light emitting display panel may include a quantum dot, a quantum rod, and/or the like. For the sake of simplicity, the description that follows will refer to an example in which the display panel DP is an organic light emitting display panel.

The display panel DP may include a substrate SUB, a pixel layer PXL disposed on the substrate SUB, a thin encapsulation layer TFE disposed on the substrate SUB to cover the pixel layer PXL, and a protection substrate PS disposed below (e.g., attached to or coupled to) the substrate SUB. The substrate SUB may be a transparent substrate and may include a flexible plastic substrate. For example, the substrate SUB may include polyimide (PI).

The substrate SUB may include the display region DA and the non-display region NDA near the display region DA, similar to the display surface DS of the display device DD. The pixel layer PXL may be disposed on the display region DA of the substrate SUB. The pixel layer PXL may include a plurality of pixels, each of which includes an emission element.

The thin encapsulation layer TFE may include at least two inorganic layers and an organic layer disposed between the inorganic layers. The inorganic layers may include an inorganic material and may protect the pixel layer PXL from moisture or oxygen. The organic layer may include an organic material and may protect the pixel layer PXL from a contamination material such as dust particles.

The protection substrate PS may protect a bottom portion of the substrate SUB. The protection substrate PS may include a flexible plastic substrate. For example, the protection substrate PS may include polyethylene terephthalate (PET), or any other suitable material known to those skilled in the art.

The touch sensing part TSP may sense an external input (e.g., a touch event from a user), may generate an input signal from the sensed external input, and may provide the input signal to the display panel DP. The touch sensing part TSP may include a plurality of touch sensor units, which are used to sense the external input. The touch sensor units may sense an external input in a capacitive manner. The display panel DP may receive the input signal from the touch sensing part TSP and may generate an image corresponding to the input signal.

The window WIN may protect the display panel DP and the touch sensing part TSP from an external scratch and/or an external impact. The window WIN may be attached to the touch sensing part TSP by the adhesive agent OCA. The adhesive agent OCA may include an optically clear adhesive. An image produced by the display panel DP may be provided to a user through the window WIN.

The cushion layer CSL may absorb an external impact, which is exerted on a lower portion of the display module DM, thereby protecting the display panel DP. The cushion layer CSL may include a foam sheet having an elastic property.

Figure 4:
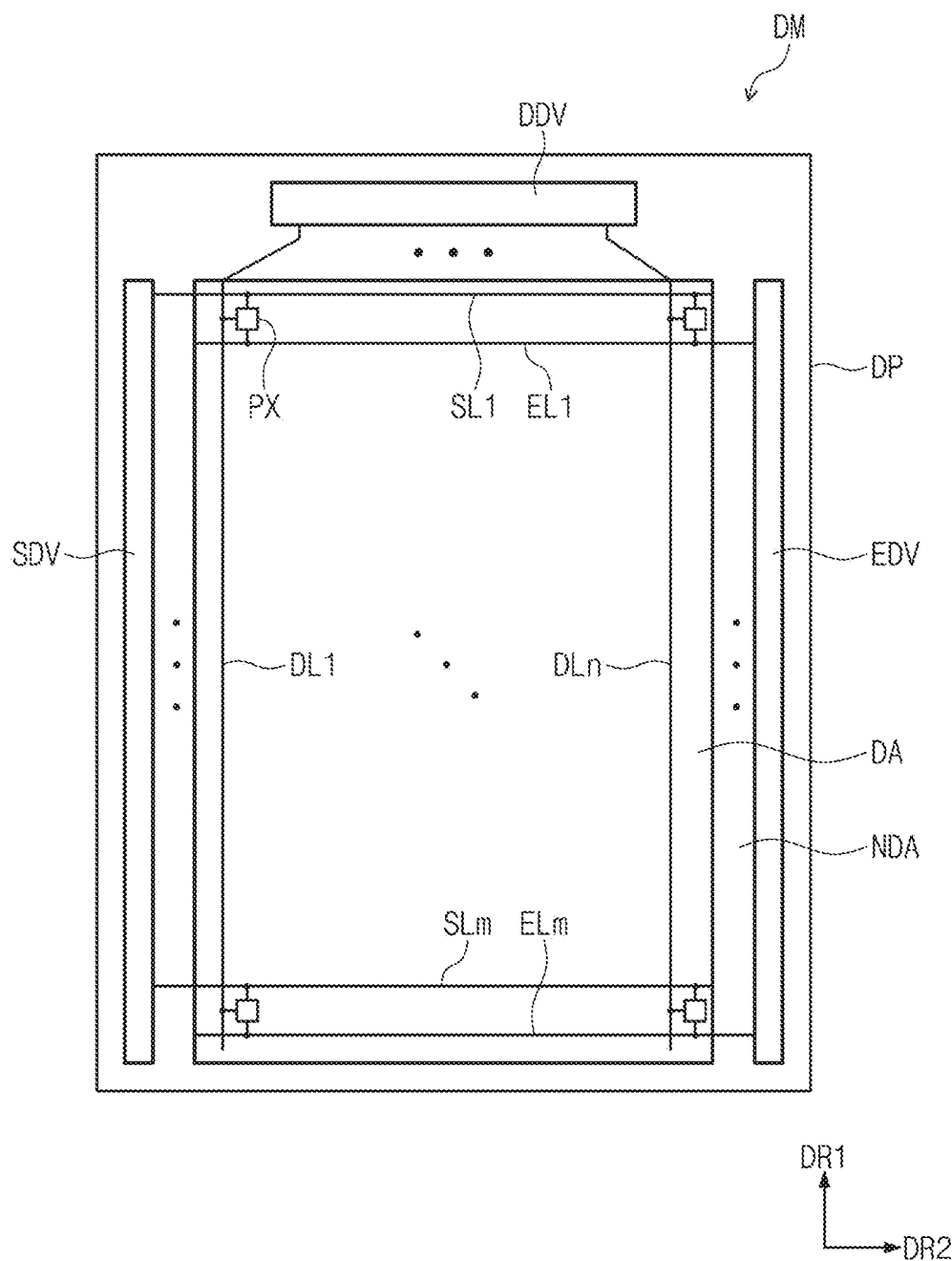
FIG. 4 is a plan view illustrating the display module of FIG. 3.

FIG. 4 is a plan view illustrating the display module of FIG. 3.

Referring to FIG. 4, the display module DM may include the display panel DP, a scan driver SDV, a data driver DDV, and an emission driver EDV. A planar structure of the display panel DP is exemplarily illustrated in FIG. 4, but a planar structure of the touch sensing part TSP is not shown.

The display panel DP may be a flexible display panel. For example, the display panel DP may include a plurality of electronic devices disposed on a flexible substrate. The display panel DP may have a rectangular shape, whose long sides are parallel to the first direction DR1 and whose short sides are parallel to the second direction DR2. The display panel DP may include a display region DA and a non-display region NDA enclosing (e.g., surrounding, encircling or around the periphery of) the display region DA, similar to the display surface DS of the display device DD.

The display panel DP may include a plurality of pixels PX, a plurality of scan lines SL1-SLm, a plurality of data lines DL1-DLn, and a plurality of emission lines EL1-ELm, where m and n are natural numbers. The pixels PX may be arranged in a matrix shape, but the inventive concept is not limited to this example. For example, the arrangement of the pixels PX may be variously changed in any suitable manner. The pixels PX may be disposed in the display region DA and may be connected to the scan lines SL1-SLm, the data lines DL1-DLn, and the emission lines EL1-ELm.

The scan driver SDV, the data driver DDV, and the emission driver EDV may be disposed in the non-display region NDA. The scan driver SDV and the emission driver EDV may be disposed adjacent to the long sides, respectively, of the display panel DP. The data driver DDV may be manufactured in the form of an integrated circuit chip and may be disposed adjacent to one of the short sides of the display panel DP.

The scan lines SL1-SLm may be extended in the second direction DR2 and may be connected to the scan driver SDV. The data lines DL1-DLn may be extended in the first direction DR1 and may be connected to the data driver DDV. The emission lines EL1-ELm may be extended in the second direction DR2 and may be connected to the emission driver EDV.

The scan driver SDV may produce (or generate) a plurality of scan signals, and the scan signals may be applied to the pixels PX through the scan lines SL1-SLm. The scan signals may be sequentially applied to the pixels PX. The data driver DDV may produce (or generate) a plurality of data voltages, and the data voltages may be applied to the pixels PX through the data lines DL1-DLn. The emission driver EDV may produce (or generate) a plurality of emission signals, and the emission signals may be applied to the pixels PX through the emission lines EL1-ELm.

In some embodiments, the display module DM may include a timing controller for controlling operations of the scan driver SDV, the data driver DDV, and the emission driver EDV.

The timing controller may generate scan control signals, data control signals, and emission control signals in response to control signals to be transmitted from the outside. The timing controller may receive image signals from the outside, may convert the image signals to a data format, which is suitable for interface specifications for the data driver DDV, and may provide the converted data to the data driver DDV.

The scan driver SDV may produce (or generate) scan signals in response to the scan control signal, and the emission driver EDV may produce (or generate) emission signals in response to the emission control signal. The data driver DDV may receive the image signals of the converted data format and then may generate data voltages corresponding to the image signals, in response to the data control signal.

The pixels PX may receive the data voltages in response to the scan signals. The pixels PX may emit light, which has a brightness level corresponding to the data voltage and constitutes an image, in response to the emission signals. A light-emitting time period of the pixel PX may be controlled by the emission signals.

Figure 5:
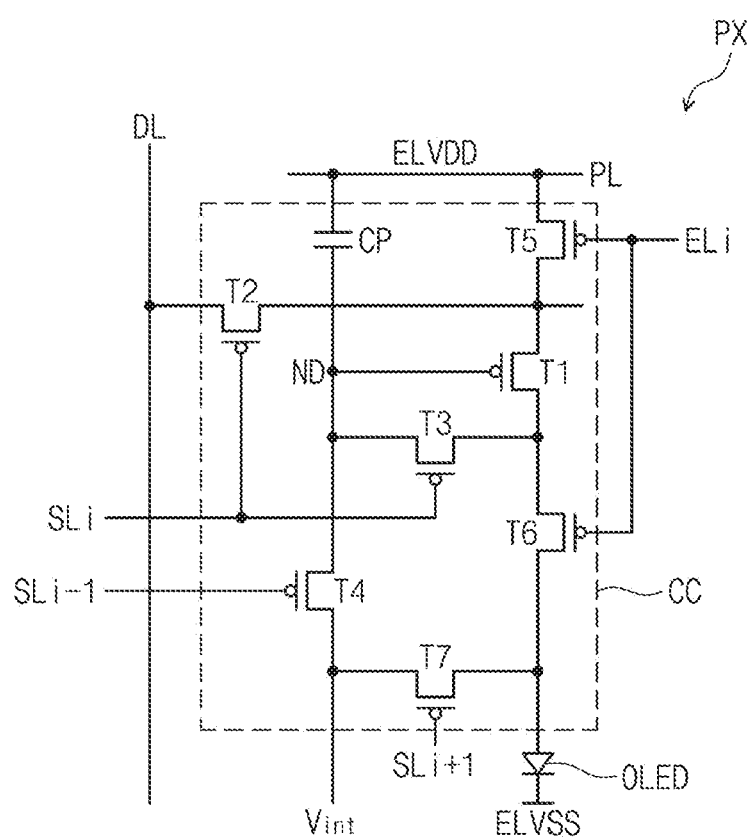
FIG. 5 is an equivalent circuit diagram exemplarily illustrating one of pixels of FIG. 4.

FIG. 5 is an equivalent circuit diagram exemplarily illustrating one of pixels of FIG. 4.

Referring to FIG. 5, the pixel PX may include an emission element OLED and a pixel circuit CC. The pixel circuit CC may include a plurality of transistors T1-T7 and a capacitor CP. The pixel circuit CC may control an amount of current flowing through the emission element OLED, in response to the data signal.

The emission element OLED may emit light, whose brightness is determined by an amount of current supplied from the pixel circuit CC. For this, a first voltage ELVDD may be set to a level that is higher than a level of a second voltage ELVSS.

Each of the transistors T1-T7 may include an input or source electrode, an output or drain electrode, and a control or gate electrode. In the present specification, for convenience in description, one of the input and output electrodes may be referred to as "a first electrode", and the other may be referred to as "a second electrode".

The first electrode of the first transistor T1 may be coupled to the first voltage ELVDD through the fifth transistor T5, and the second electrode of the first transistor T1 may be coupled to an anode of the emission element OLED through the sixth transistor T6. The first transistor T1 may be defined as (or referred to as) a driving transistor. The first transistor T1 may control an amount of current flowing through the emission element OLED, in response to a voltage applied to the control electrode of the first transistor T1.

The first and second electrodes of the second transistor T2 may be disposed between and coupled to a data line DL and the first electrode of the first transistor T1, and the control electrode of the second transistor T2 may be coupled to an i-th scan line SLi. The second transistor T2 may be turned on by an i-th scan signal Si, which is provided through the i-th scan line SLi, to electrically connect the data line DL to the first electrode of the first transistor T1.

The first and second electrodes of the third transistor T3 may be disposed between and respectively coupled to the second and control electrodes of the first transistor T1. The control electrode of the third transistor T3 may be coupled to the i-th scan line SLi. The third transistor T3 may be turned on by the i-th scan signal Si, which is provided through the i-th scan line SLi to electrically connect the second and control electrodes of the first transistor T1 to each other. If the third transistor T3 is turned on, the first transistor T1 may function as a diode.

The first and second electrodes of the fourth transistor T4 may be disposed between and respectively coupled to a node ND and an initialization power generator (e.g., a power source for providing the initialization voltage Vint). The control electrode of the fourth transistor T4 may be coupled to an (i−1)-th scan line SLi−1. The fourth transistor T4 may be turned on by an (i−1)-th scan signal Si−1 provided through the (i−1)-th scan line SLi−1 to provide the initialization voltage Vint to the node ND.

The first and second electrodes of the fifth transistor T5 may be disposed between and respectively coupled to a power line PL and the first electrode of the first transistor T1. The control electrode of the fifth transistor T5 may be coupled to an i-th emission line ELi.

The first and second electrodes of the sixth transistor T6 may be disposed between and respectively coupled to the second electrode of the first transistor T1 and the anode of the emission element OLED. The control electrode of the sixth transistor T6 may be coupled to the i-th emission line ELi.

The first and second electrodes of the seventh transistor T7 may be disposed between and respectively coupled to the initialization power generator (i.e., the power source for providing the initialization voltage Vint) and the anode of the emission element OLED. The control electrode of the seventh transistor T7 may be coupled to an (i+1)-th scan line SLi+1. The seventh transistor T7 may be turned on by an (i+1)-th scan signal Si+1 provided the (i+1)-th scan line SLi+1 to provide the initialization voltage Vint to the anode of the emission element OLED.

The capacitor CP may be disposed between the power line PL and the node ND. The capacitor CP may store a data voltage. When the fifth and sixth transistors T5 and T6 are turned on, an amount of current flowing through the first transistor T1 may be controlled by a voltage stored in the capacitor CP.

FIG. 5 illustrates an example in which PMOS transistors are used as the transistors T1-T7, but the inventive concept is not limited to this example. For example, the transistors T1-T7 may be NMOS transistors, and those skilled in the art would appreciate relevant changes to the applied voltage levels and/or circuit configuration required.

Figure 6:
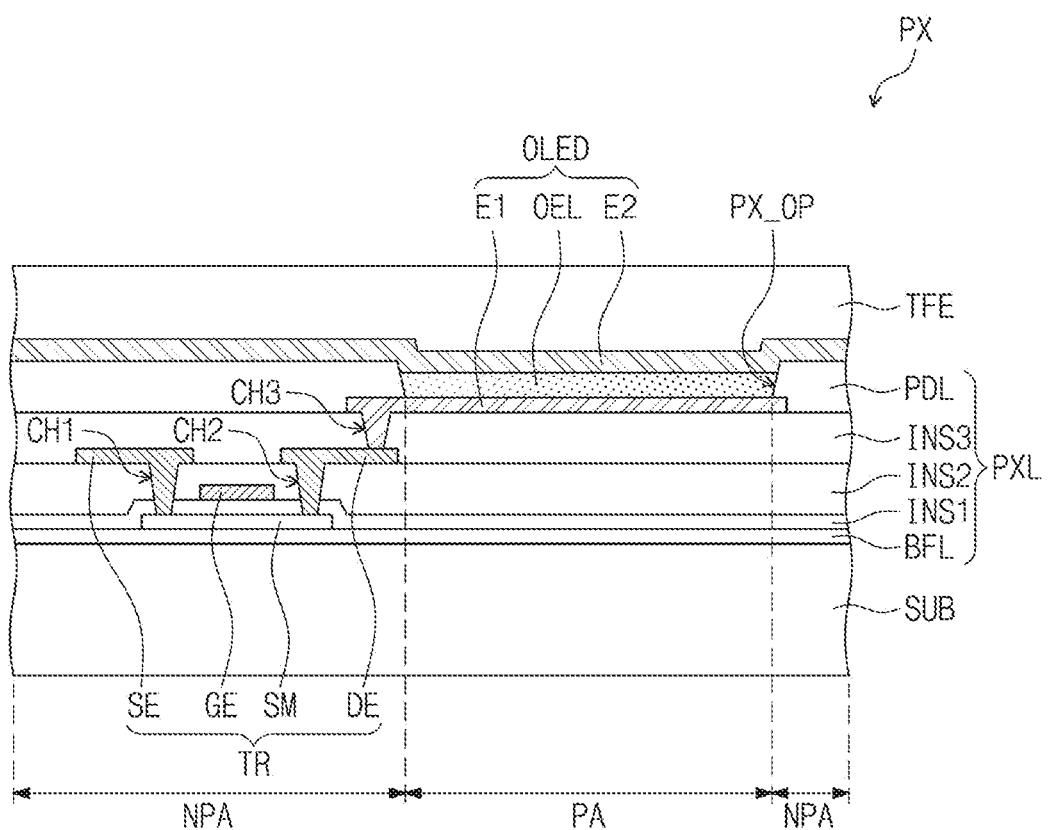
FIG. 6 is a sectional view illustrating a portion of a display device, in which an emission element of FIG. 5 is disposed.

FIG. 6 is a sectional view illustrating a portion of a display device, in which an emission element of FIG. 5 is disposed.

Referring to FIG. 6, the pixel PX may include the emission element OLED and a transistor TR connected to the emission element OLED. The emission element OLED may include a first electrode E1, a second electrode E2, and an organic emission layer OEL, which is disposed between the first electrode E1 and the second electrode E2 along the third direction DR3. The transistor TR may be the sixth transistor T6 shown in FIG. 5, for example. The emission element OLED may be defined as an organic light emitting element.

The first electrode E1 may be an anode, and the second electrode E2 may be a cathode. The first electrode E1 may be defined as a pixel electrode, and the second electrode E2 may be defined as a common electrode.

The pixel PX may be divided into a pixel region PA and a non-pixel region NPA around (e.g., surrounding or around the periphery of) the pixel region PA. The emission element OLED may be disposed in the pixel region PA, and the transistor TR may be disposed in the non-pixel region NPA.

The transistor TR and the emission element OLED may be disposed on the substrate SUB. A buffer layer BFL may be disposed on the substrate SUB, and in some embodiments, the buffer layer BFL may be formed of or include at least one of inorganic materials.

A semiconductor layer SM of the transistor TR may be disposed on the buffer layer BFL. The semiconductor layer SM may be formed of or include at least one of suitable inorganic semiconductor materials, such as, for example, amorphous or polycrystalline silicon, or suitable organic semiconductor materials. In some embodiments, the semiconductor layer SM may be formed of or include at least one of suitable oxide semiconductor materials. In some embodiments, the semiconductor layer SM may include a source region, a drain region, and a channel region between the source region and the drain region.

A first insulating layer INS1 may be disposed on the buffer layer BFL to cover the semiconductor layer SM. The first insulating layer INS1 may be formed of or include an inorganic material. A gate electrode GE of the transistor TR may be disposed on the first insulating layer INS1 and may be overlapped with the semiconductor layer SM. The gate electrode GE may be disposed to be overlapped with the channel region of the semiconductor layer SM.

A second insulating layer INS2 may be disposed on the first insulating layer INS1 to cover the gate electrode GE. The second insulating layer INS2 may include an organic material and/or an inorganic material.

A source electrode SE and a drain electrode DE of the transistor TR may be disposed on the second insulating layer INS2, and are spaced apart from each other. The source electrode SE may be connected to the source region of the semiconductor layer SM through a first contact hole CH1, which is defined in the first insulating layer INS1 and the second insulating layer INS2. The drain electrode DE may be connected to the drain region of the semiconductor layer SM through a second contact hole CH2, which is defined in the first insulating layer INS1 and the second insulating layer INS2.

A third insulating layer INS3 may be disposed on the second insulating layer INS2 to cover the source electrode SE and the drain electrode DE of the transistor TR. The third insulating layer INS3 may be defined as a planarization layer providing a substantially flat or flat top surface and may include an organic material.

The first electrode E1 may be disposed on the third insulating layer INS3. The first electrode E1 may be connected to the drain electrode DE of the transistor TR through third contact holes CH3 defined in the third insulating layer INS3.

A pixel definition layer PDL may be disposed on the first electrode E1 and the third insulating layer INS3 to expose a specific portion of the first electrode E1. An opening PX_OP, which exposes the specific portion of the first electrode E1, may be defined in the pixel definition layer PDL.

The organic emission layer OEL may be disposed in the opening PX_OP and on the first electrode E1. The organic emission layer OEL may generate one of red, green, and blue lights. However, the inventive concept is not limited to this example, and in some embodiments, the organic emission layer OEL may generate a white light through combination of organic materials capable of generating red, green, and blue lights.

The second electrode E2 may be disposed on the pixel definition layer PDL and the organic emission layer OEL. The thin encapsulation layer TFE may be disposed on the emission element OLED to cover the pixel PX. A layer between the substrate SUB and the thin encapsulation layer TFE may be defined as the pixel layer PXL.

The first voltage ELVDD may be applied to the first electrode E1, and the second voltage ELVSS may be applied to the second electrode E2. In the case where holes and electrons are injected into the organic emission layer OEL, the holes and electrons may be recombined to each other to produce excitons, and light may be emitted from the emission element OLED when the excitons transition to a ground state. The emission element OLED may emit red, green, or blue light, which constitutes a part of an image provided to a user, using a current flowing therethrough.

Figure 7:
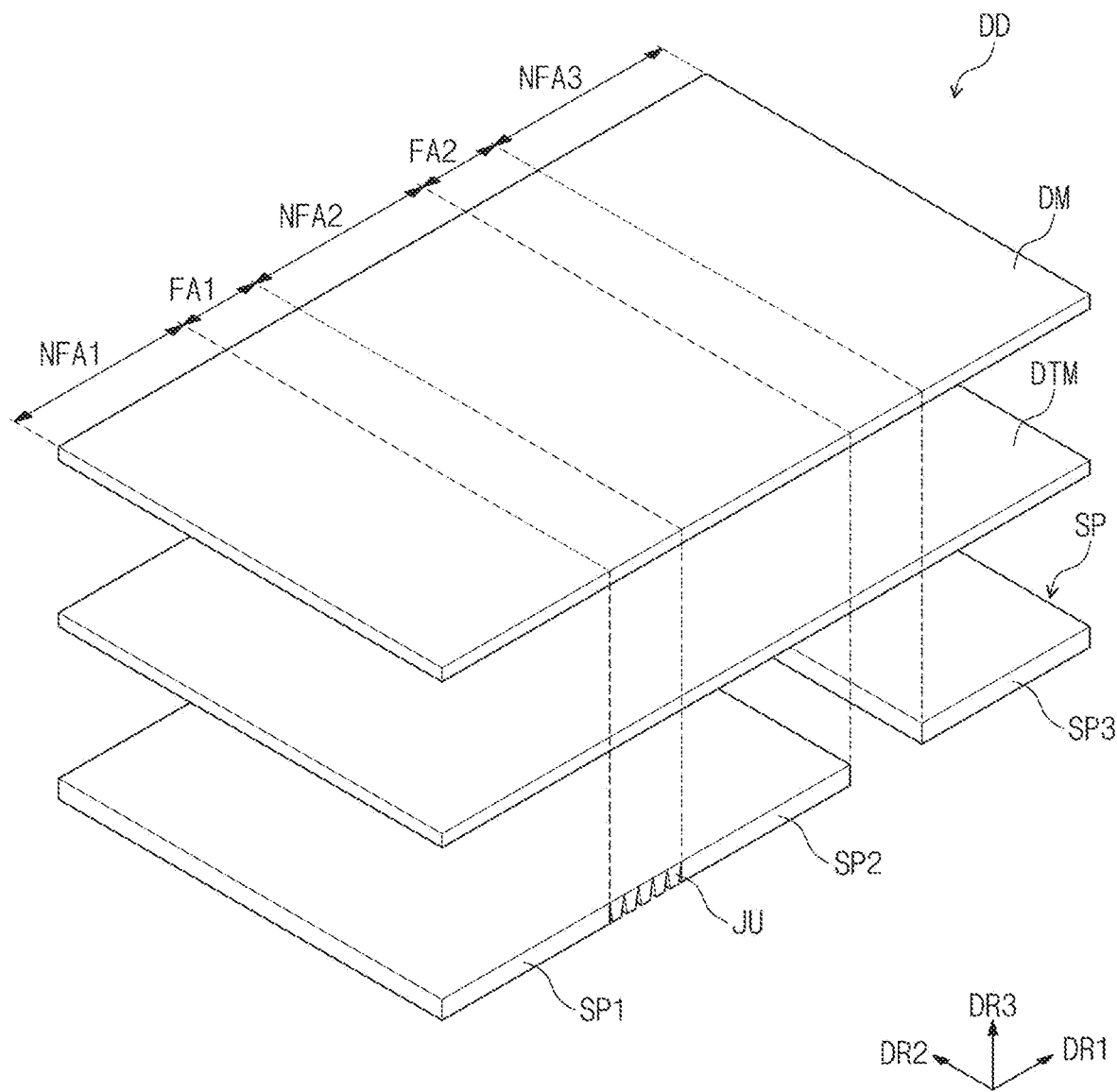
FIG. 7 is an exploded perspective view illustrating a display device according to some embodiments of the inventive concept.

FIG. 7 is an exploded perspective view illustrating a display device according to some embodiments of the inventive concept.

Referring to FIG. 7, the display device DD according to some embodiments of the inventive concept may include the display module DM, a digitizer module DTM disposed below (e.g., attached to or coupled to) the display module DM, and a supporting portion SP disposed below (e.g., attached to or coupled to) the digitizer module DTM.

The display module DM may include first, second, and third non-folding regions NFA1, NFA2, and NFA3 and first and second folding regions FA1 and FA2, like (e.g., similar to or substantially the same as) the display device DD. The first, second, and third non-folding regions NFA1, NFA2, and NFA3 and the first and second folding regions FA1 and FA2 may be provided to have the same arrangement as that in the previous embodiment of FIGS. 1 and 2, and thus, a detailed description thereof may be omitted (e.g., not repeated).

The digitizer module DTM may have a rectangular shape, whose long sides are parallel to the first direction DR1, whose short sides are parallel to the second direction DR2. The digitizer module DTM may be realized in a pressure sensing manner. The digitizer module DTM may be configured to sense a pressure applied to the display device DD.

In the case where a user exerts a pressure (e.g., presses) on the display device DD using a digitizer pen, the digitizer module DTM may sense a change in pressure caused by the digitizer pen. The digitizer module DTM may realize an input, which is associated with the sensed pressure. The display device DD may realize an output corresponding to the input. For example, a user may make a drawing on the display device DD using the digitizer pen.

The supporting portion SP may support the display module DM and the digitizer module DTM. The supporting portion SP may include a first supporting portion SP1, a second supporting portion SP2, a third supporting portion SP3, and a plurality of joint units JU. The first supporting portion SP1, the second supporting portion SP2, and the third supporting portion SP3 may be arranged along the first direction DR1. The joint units JU may be disposed between the first supporting portion SP1 and the second supporting portion SP2 along the first direction DR1.

The first supporting portion SP1 may be disposed below (e.g., attached to or coupled to) the digitizer module DTM and may be overlapped with the first non-folding region NFA1 when viewed from a plan view. The second supporting portion SP2 may be disposed below (e.g., attached to or coupled to) the digitizer module DTM and may be overlapped with the second non-folding region NFA2 when viewed from a plan view. The joint units JU may be disposed below (e.g., attached to or coupled to) the digitizer module DTM and may be overlapped with the first folding region FA1 when viewed from a plan view. The joint units JU may be extended in the second direction DR2 and may be arranged along the first direction DR1.

The third supporting portion SP3 may be disposed below (e.g., attached to or coupled to) the digitizer module DTM and may be overlapped with the third non-folding region NFA3 when viewed from a plan view. The third supporting portion SP3 may be spaced apart from the second supporting portion SP2 along the first direction DR1. The supporting portion SP may not be disposed in a region overlapped with the second folding region FA2 when viewed from a plan view. In some embodiments, the third supporting portion SP3 and the second supporting portion SP2 define opposite sides of an opening or gap in the supporting portion SP that is overlapped with the second folding region FA2 when viewed from a plan view.

In some embodiments, adhesive agents may be disposed between the display module DM and the digitizer module DTM and between the digitizer module DTM and the supporting portion SP. The display module DM, the digitizer module DTM, and the supporting portion SP may be coupled to each other by the adhesive agents. The adhesive agents may be pressure sensitive adhesive agents, for example.

Figure 8:
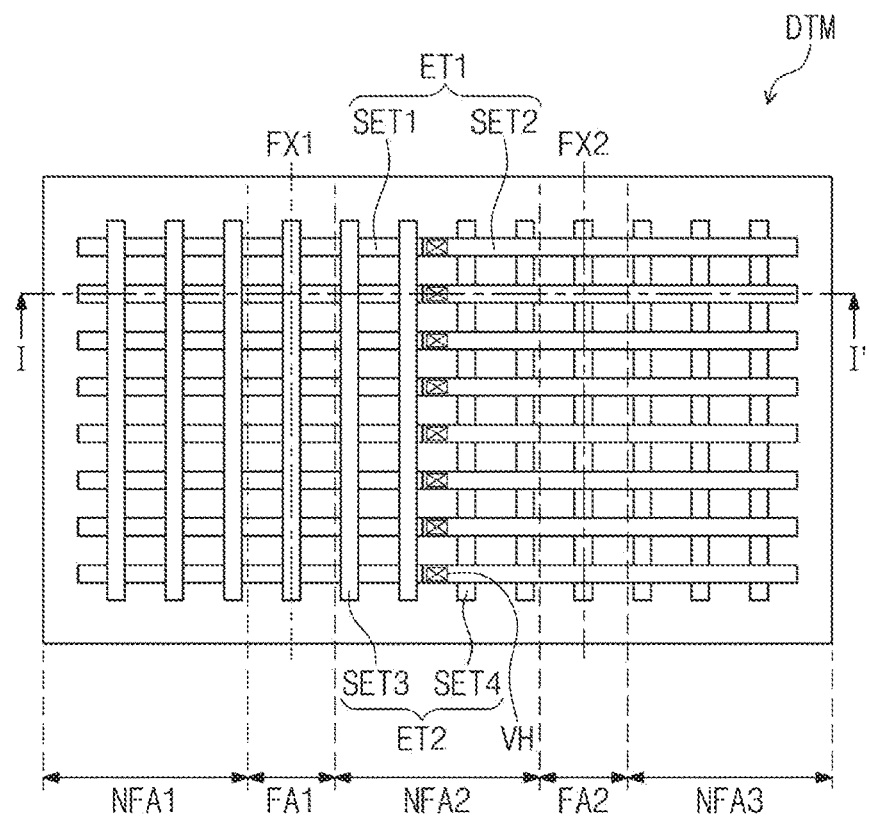
FIG. 8 is a plan view illustrating a digitizer module of FIG. 7.
Figure 9:
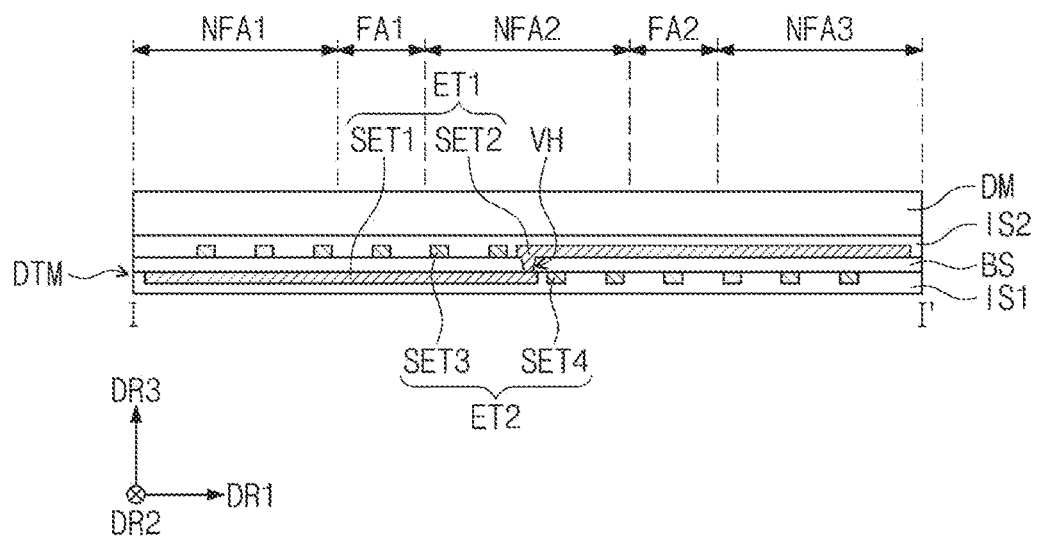
FIG. 9 is a sectional view taken along the line I-I' of FIG. 8.

FIG. 8 is a plan view illustrating a digitizer module of FIG. 7. FIG. 9 is a sectional view taken along the line I-I' of FIG. 8.

In order to provide a more detailed understanding of some embodiments of the inventive concept, the display module DM, along with the digitizer module, are illustrated in FIG. 9.

Referring to FIG. 8, the digitizer module DTM may include a plurality of first electrodes ET1 and a plurality of second electrodes ET2, which are insulated from each other and are disposed to cross each other. For example, in some embodiments, the plurality of first electrodes ET1 and the plurality of second electrodes ET2 do not intersect or physically contact each other. The first electrodes ET1 may be extended in the first direction DR1 and may be arranged along the second direction DR2. The first electrodes ET1 may be extended to cross the first and second folding axes FX1 and FX2. The second electrodes ET2 may be extended in the second direction DR2 and may be arranged along the first direction DR1.

In the first folding region FA1, the first electrodes ET1 may be disposed below (e.g., attached to or coupled to) the second electrodes ET2. In the second folding region FA2, the first electrodes ET1 may be disposed on the second electrodes ET2.

The first electrodes ET1 may include a plurality of first sub-electrodes SET1 and a plurality of second sub-electrodes SET2. The first sub-electrodes SET1 may be overlapped with the first folding axis FX1. In some embodiments, the first sub-electrodes SET1 may be disposed to be overlapped with the first non-folding region NFA1, the first folding region FA1, and the second non-folding region NFA2.

The second sub-electrodes SET2 may be overlapped with the second folding axis FX2. In some embodiments, the second sub-electrodes SET2 may be disposed to be overlapped with the third non-folding region NFA3, the second folding region FA2, and the second non-folding region NFA2.

The first sub-electrodes SET1 and the second sub-electrodes SET2 may be disposed on different layers or at different layers from each other. In the second non-folding region NFA2, the first sub-electrodes SET1 and the second sub-electrodes SET2, which are disposed at different layers, may be electrically connected to each other. Portions of the first sub-electrodes SET1 may be electrically connected to portions of the second sub-electrodes SET2 through via holes VH. The via holes VH according to some embodiments may be described in more detail with reference to FIG. 9.

The second electrodes ET2 may include a plurality of third sub-electrodes SET3 and a plurality of fourth sub-electrodes SET4. The third sub-electrodes SET3 may be disposed to be overlapped with the first non-folding region NFA1, the first folding region FA1, and the second non-folding region NFA2. The fourth sub-electrodes SET4 may be disposed to be overlapped with the third non-folding region NFA3, the second folding region FA2, and the second non-folding region NFA2.

The third sub-electrodes SET3 may be disposed on a layer different from that below the fourth sub-electrodes SET4. For example, the third sub-electrodes SET3 may be at a layer above the fourth sub-electrodes SET4. In other words, the fourth sub-electrodes SET4 may be at a layer below the third sub-electrodes SET3. The third sub-electrodes SET3 may be overlapped with the first sub-electrodes SET1, and the fourth sub-electrodes SET4 may be overlapped with the second sub-electrodes SET2. The first sub-electrodes SET1 may be disposed below (e.g., attached to or coupled to) the third sub-electrodes SET3, and the second sub-electrodes SET2 may be disposed on the fourth sub-electrodes SET4.

Referring to FIG. 9, the digitizer module DTM may include a base substrate BS, a plurality of the first electrodes ET1, a plurality of the second electrodes ET2, a first insulating layer IS1, and a second insulating layer IS2. The base substrate BS may include a flexible plastic substrate. For example, the base substrate BS may include polyimide (PI).

The first sub-electrodes SET1 may be disposed below (e.g., attached to or coupled to) the base substrate BS, and the second sub-electrodes SET2 may be disposed on the base substrate BS. The third sub-electrodes SET3 may be disposed on the base substrate BS, and the fourth sub-electrodes SET4 may be disposed below (e.g., attached to or coupled to) the base substrate BS.

The first sub-electrodes SET1 may be disposed at a level (or layer) lower than the second sub-electrodes SET2, and the third sub-electrodes SET3 may be disposed at a level (or layer) higher than the fourth sub-electrodes SET4. Thus, the second sub-electrodes SET2 and the third sub-electrodes SET3 may be closer to the display module DM than the first sub-electrodes SET1 and the fourth sub-electrodes SET4 are to the display module DM.

The second sub-electrodes SET2 may be electrically connected to the first sub-electrodes SET1 through the via holes VH, which are defined in the base substrate BS and are overlapped with the second non-folding region NFA2. Portions of the second sub-electrodes SET2 may be respectively connected to portions of the first sub-electrodes SET1 through the via holes VH.

The first insulating layer IS1 may be disposed below (e.g., attached to or coupled to) the base substrate BS to cover the first and fourth sub-electrodes SET1 and SET4. The second insulating layer IS2 may be disposed on the base substrate BS to cover the second and third sub-electrodes SET2 and SET3.

Figure 10:
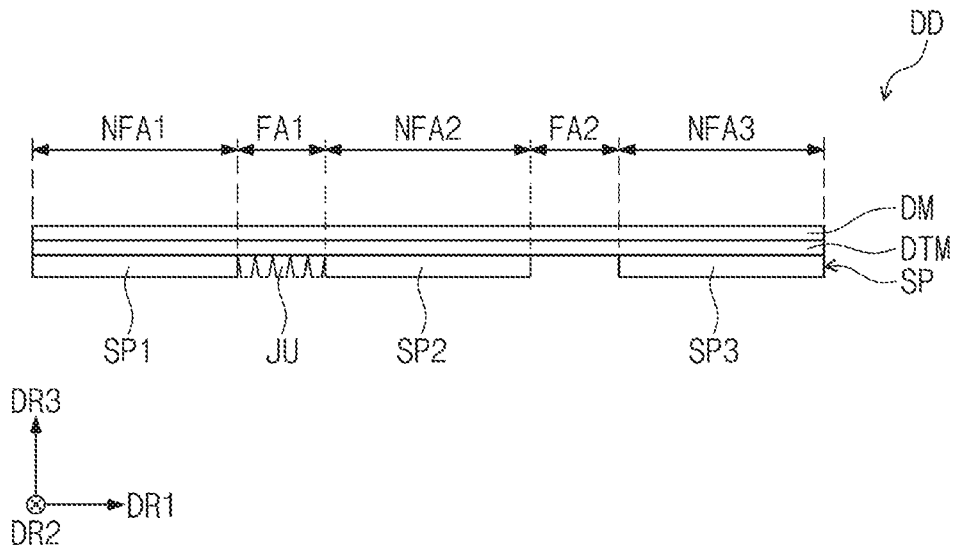
FIG. 10 is a side view illustrating the display device of FIG. 7.
Figure 11:
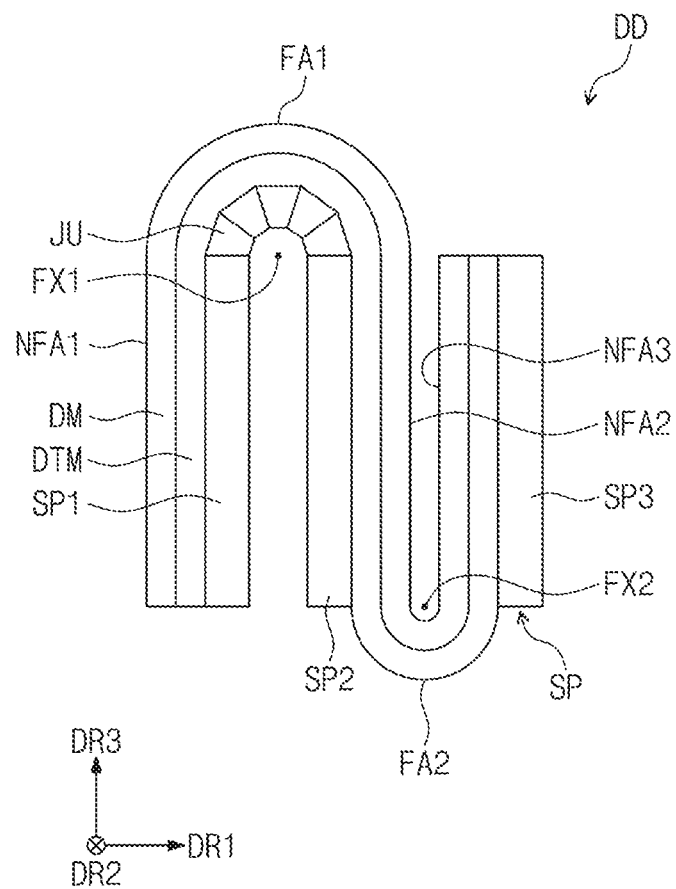
FIG. 11 is a diagram illustrating a folded state of the display device of FIG. 10.

FIG. 10 is a side view illustrating the display device of FIG. 7 according to some embodiments. FIG. 11 is a diagram illustrating a folded state of the display device of FIG. 10.

FIG. 10 illustrates a shape, viewed in the second direction DR2, of the display device DD, in which the display module DM, the digitizer module DTM, and the supporting portion SP are coupled to each other. An enlarged structure of the display device DD in a folded state is illustrated in FIG. 11 so as to more clearly illustrate the folded structure of the display device DD.

Referring to FIGS. 10 and 11, the first, second, and third supporting portions SP1, SP2, and SP3 may be overlapped with the first, second, and third non-folding regions NFA1, NFA2, and NFA3, respectively, and the joint units JU may be overlapped with the first folding region FA1. In some embodiments, an opening or gap in the supporting portion SP defined by the second and third support portions SP2 and SP3 may be overlapped with the second folding region FA2. A width of each of the joint units JU may decrease (e.g., linearly decrease) in a direction (e.g., a direction opposite the third direction DR3) from a top of each of the joint units JU toward a bottom of each of the joint units JU when viewed in the second direction DR2 (e.g., see FIG. 10). For example, when viewed in the second direction DR2, each of the joint units JU may have an inverted trapezoidal shape.

The first folding region FA1 and the second folding region FA2 of the display module DM may be overlapped with the first folding axis FX1 and the second folding axis FX2, respectively. The first folding region FA1 may be folded along the first folding axis FX1, and the second folding region FA2 may be folded along the second folding axis FX2.

A top surface of the display module DM may be defined as the display surface DS of the display device DD. A bottom surface of the display module DM may be a surface, which is opposite to the top surface of the display module DM, and may be defined as a surface facing the digitizer module DTM.

When the first folding region FA1 is folded, the top surface of the first folding region FA1, which is a portion of the top surface of the display module DM, may be convexly curved, and the bottom surface of the first folding region FA1 may be concavely curved. In other words, the first folding region FA1 may be folded in an out-folding manner. The first supporting portion SP1 and the second supporting portion SP2 may be disposed to face each other. By contrast, the first non-folding region NFA1 and the second non-folding region NFA2 may be disposed at opposite sides such that they do not face each other. Side surfaces of the joint units JU may be disposed adjacent to each other. In some embodiments, the side surfaces of adjacent joint units JU may contact (e.g., directly contact) each other when the display device DD is folded (e.g., see FIG. 11).

When the second folding region FA2 is folded, the top surface of the second folding region FA2, which is a portion of the top surface of the display module DM, may be concavely curved, and the bottom surface of the second folding region FA2 may be convexly curved. In other words, the second folding region FA2 may be folded in an in-folding manner. The third supporting portion SP3 may be disposed not to face (e.g., to face away from) the second supporting portion SP2. For example, the second supporting portion SP2 and the third supporting portion SP3 may be disposed at opposite sides with the display module DM and the digitizer module DTM interposed therebetween. The second non-folding region NFA2 and the third non-folding region NFA3 may be disposed to face each other.

In some embodiments, the display device DD may further include a hinge structure, which is connected to the supporting portion SP to provide the first and second folding axes FX1 and FX2 to the display device DD.

Figure 12:
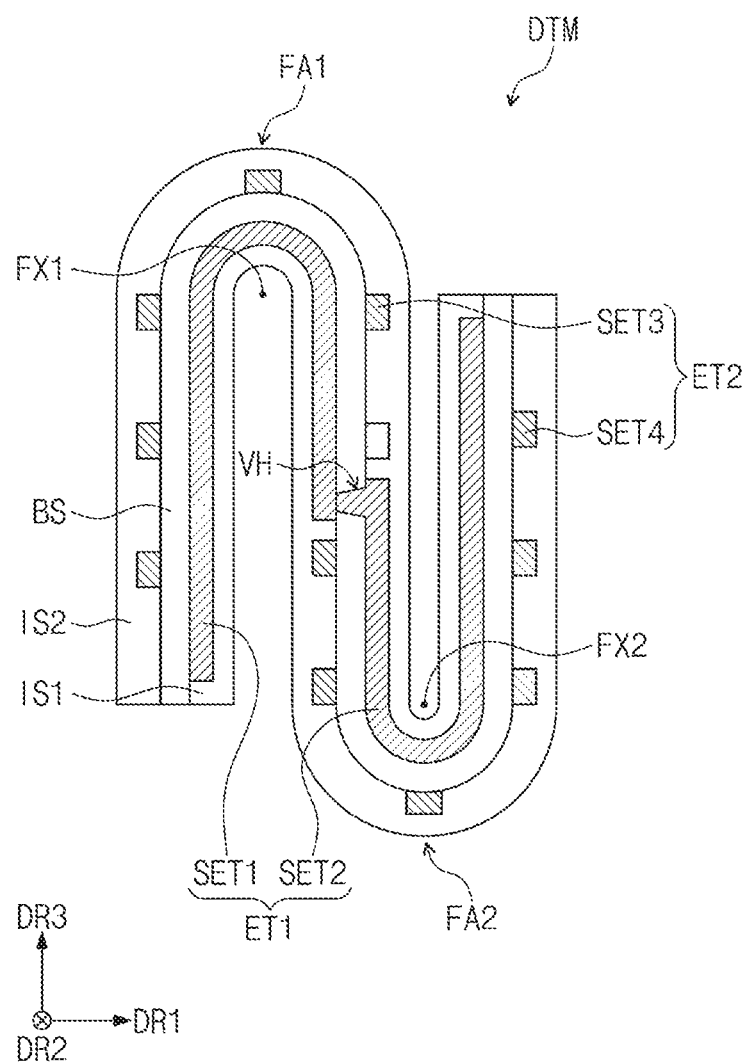
FIG. 12 is a sectional view illustrating a digitizer module of FIG. 11.

FIG. 12 is a sectional view illustrating a digitizer module of FIG. 11.

FIG. 12 substantially illustrates a vertical section of the digitizer module DTM of FIG. 9, which is folded in the same manner as the display device DD of FIG. 11. An enlarged structure of the digitizer module DTM in a folded state is illustrated in FIG. 12 so as to more clearly illustrate the folded structure of the digitizer module DTM according to some embodiments. Hereinafter, for convenience of description, the sectional structure of the digitizer module DTM of FIG. 12 may be described with reference to the planar structure of the digitizer module DTM of FIG. 8.

Referring to FIGS. 8 and 12, because the second electrodes ET2 are extended parallel to first and second folding axes FX1 and FX2, the second electrodes ET2 may not be damaged, when the first and second folding regions FA1 and FA2 are folded along the first and second folding axes FX1 and FX2.

However, because the first electrodes ET1 are extended in a direction crossing the first and second folding axes FX1 and FX2, the first electrodes ET1 may be damaged, when the first and second folding regions FA1 and FA2 are folded along the first and second folding axes FX1 and FX2. For example, in the case where the first folding region FA1 is folded in an out-folding manner, a length of the top surface of the base substrate BS, which is deformed to have a convexly curved shape, may become longer than a length of the bottom surface of the base substrate BS, which is deformed to have a concavely curved shape, in the first folding region FA1.

In the case where the first sub-electrodes SET1 are disposed on the top surface of the base substrate BS and the first folding region FA1 is folded in an out-folding manner, the length of the top surface of the base substrate BS may be increased, and this may lead to an increase in strength of a tensile force exerted on the first sub-electrodes SET1. The first sub-electrodes SET1 may be damaged, due to such a tensile force.

According to some embodiments of the inventive concept, because, in the first folding region FA1 (i.e., the out-folding region), the first sub-electrodes SET1 are disposed below (e.g., attached to or coupled to) the base substrate BS, which is deformed to have a concavely curved shape, and not on or above the base substrate BS having an increasing length, it may be possible to reduce a strength of a tensile force exerted on the first sub-electrodes SET1 and thereby prevent or reduce damage to the first sub-electrodes SET1.

Similarly, because, in the second folding region FA2 (i.e., the in-folding region), the second sub-electrodes SET2 are disposed on the top surface of the base substrate BS, which is deformed to have a concavely curved shape, and not on the bottom surface of the base substrate BS having an increasing length, it may be possible to reduce a strength of a tensile force and thereby prevent or reduce damage to the second sub-electrodes SET2.

As a result, the display device DD according to some embodiments of the inventive concept may prevent or reduce damage to the digitizer module DTM, which may occur in the first and second folding regions FA1 and FA2.

Figure 13:
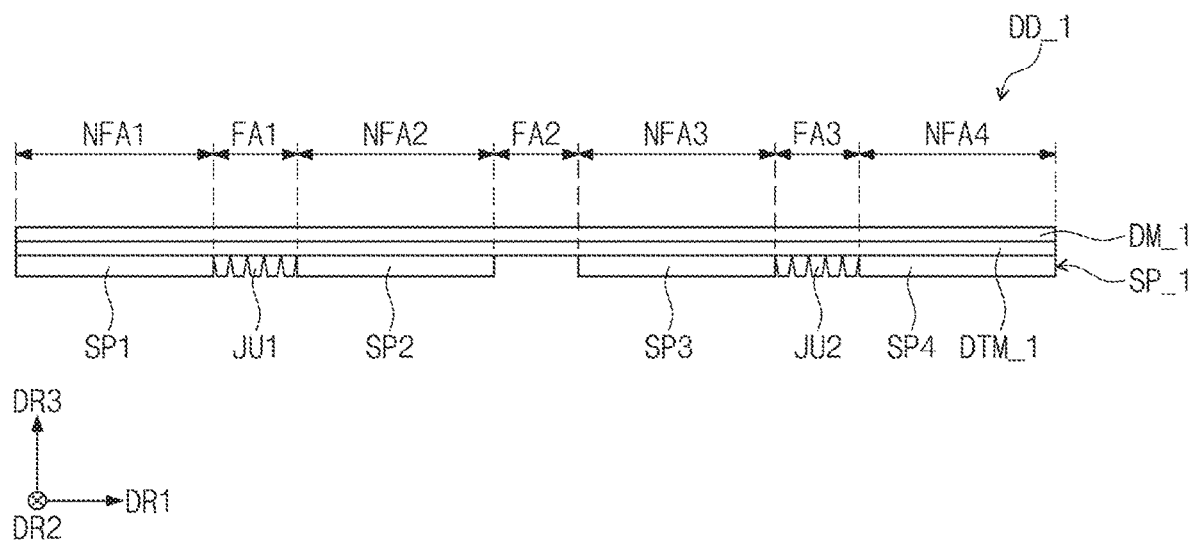
FIG. 13 is a diagram illustrating a display device according to some embodiments of the inventive concept.
Figure 14:
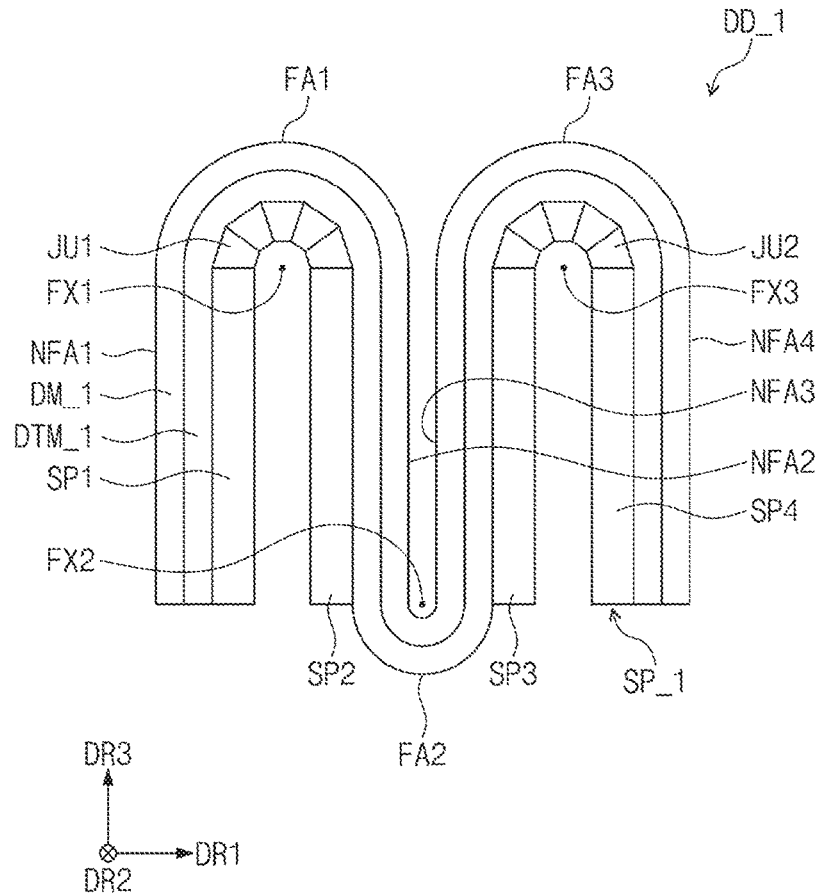
FIG. 14 is a diagram illustrating a folded state of the display device of FIG. 13.

FIG. 13 is a diagram illustrating a display device according to some embodiments of the inventive concept. FIG. 14 is a diagram illustrating a folded state of the display device of FIG. 13.

FIGS. 13 and 14 substantially illustrate side views corresponding to FIGS. 10 and 11. Thus, the following description may be focused on technical features of a display device DD_1 of FIGS. 13 and 14 that are different from those of the display device DD shown in FIGS. 10 and 11, and a feature of an element previously described with reference to FIGS. 10 and 11 may be identified by the same reference number without repeating an overlapping description thereof. An enlarged structure of the display device DD_1 in a folded state is illustrated in FIG. 14.

Referring to FIGS. 13 and 14, the display device DD_1 may include a display module DM_1, a digitizer module DTM_1 disposed below (e.g., attached to or coupled to) the display module DM_1, and a supporting portion SP_1 disposed below (e.g., attached to or coupled to) a digitizer module DTM_1.

The display module DM_1 may include first, second, third, and fourth non-folding regions NFA1, NFA2, NFA3, and NFA4 that are arranged along the first direction DR1, and first, second, and third folding regions FA1, FA2, and FA3 that are disposed between the first, second, third, and fourth non-folding regions NFA1, NFA2, NFA3, and NFA4. The third folding region FA3 may be disposed between the third non-folding region NFA3 and the fourth non-folding region NFA4.

The supporting portion SP_1 may include first, second, third, and fourth supporting portions SP1, SP2, SP3, and SP4 and first and second joint units JU1 and JU2. The fourth supporting portion SP4 may be disposed below (e.g., attached to or coupled to) the digitizer module DTM_1 and may be overlapped with the fourth non-folding region NFA4.

The first joint units JU1 may be substantially the same as or the same as the joint units JU shown in FIGS. 10 and 11. For example, the second joint units JU2 may be substantially the same as or the same as (e.g., may have substantially the same shape as or the same shape as) the first joint units JU1. The second joint units JU2 may be overlapped with the third folding region FA3 and may be disposed below (e.g., attached to or coupled to) the digitizer module DTM_1. The second joint units JU2 may be disposed between the third supporting portion SP3 and the fourth supporting portion SP4.

Other elements constituting the display module DM_1 and the supporting portion SP_1 may be substantially the same as or the same as those in the display module DM and the supporting portion SP described with reference to FIGS. 9 and 10.

The first folding region FA1 may be folded in an out-folding manner, and the second folding region FA2 may be folded in an in-folding manner. The third folding region FA3 may be overlapped with a third folding axis FX3 extending in the second direction DR2 and may be folded in an out-folding manner along the third folding axis FX3. A top surface of the third folding region FA3 may be convexly curved, and a bottom surface of the third folding region FA3 may be concavely curved. Side surfaces of the second joint units JU2 may be disposed adjacent to each other.

Figure 15:
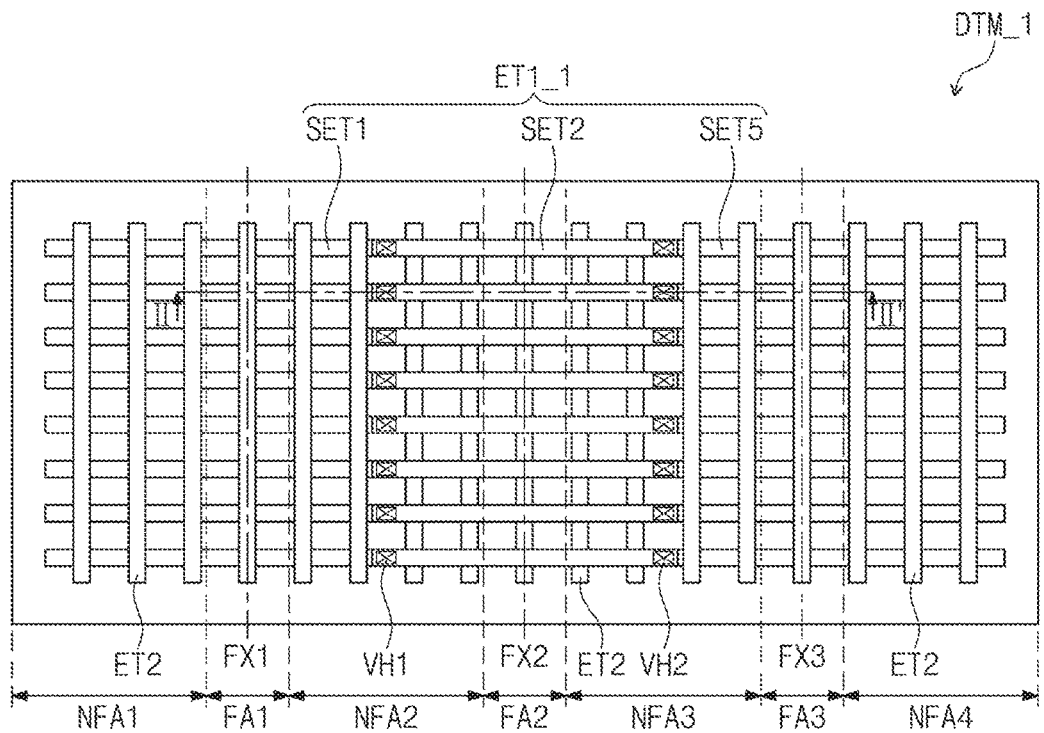
FIG. 15 is a plan view illustrating a digitizer module of FIG. 13.
Figure 15:
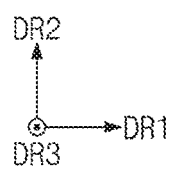
Figure 16:
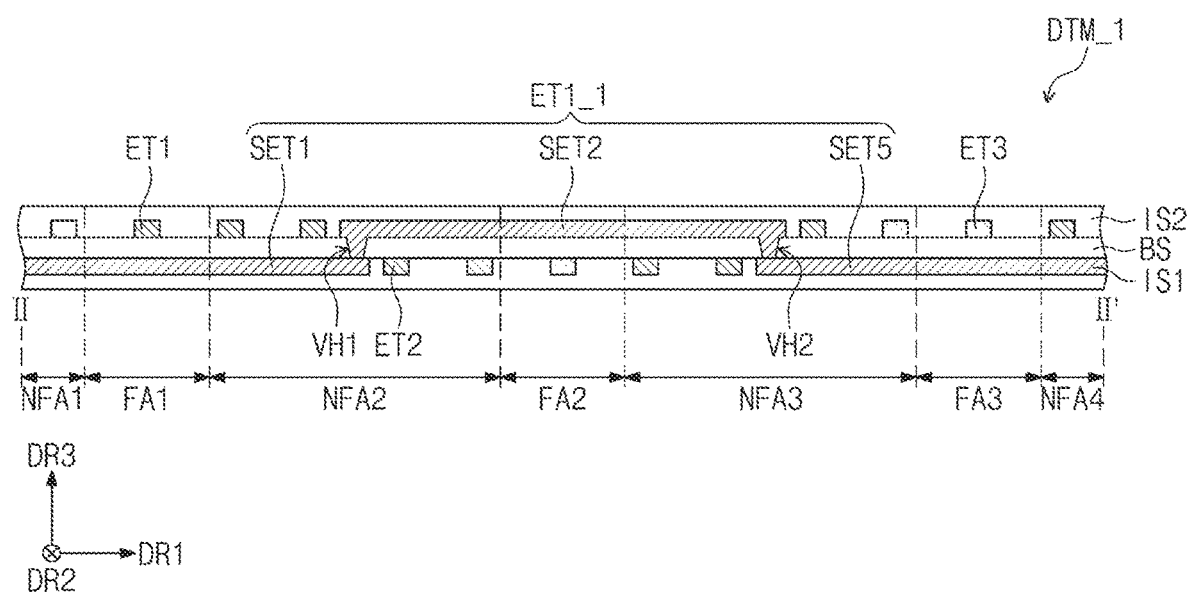
FIG. 16 is a diagram taken along the line II-II' of FIG. 15.

FIG. 15 is a plan view illustrating a digitizer module of FIG. 13. FIG. 16 is a diagram taken along the line II-II' of FIG. 15.

Referring to FIGS. 15 and 16, the digitizer module DTM_1 may include a plurality of first electrodes ET1_1, which are extended in the first direction DR1, and a plurality of second electrodes ET2, which are extended in the second direction DR2.

The first electrodes ET1_1 may include a plurality of first sub-electrodes SET1, a plurality of second sub-electrodes SET2, and a plurality of fifth sub-electrodes SET5. For convenience of description, the second electrodes ET2 are depicted with a single reference numeral, without using the terms of the sub-electrodes as in FIG. 8.

The second sub-electrodes SET2 may be electrically connected to the first sub-electrodes SET1 through first via holes VH1. The first and second sub-electrodes SET1 and SET2 may have substantially the same or the same arrangement and connection structure as those of the first and second sub-electrodes SET1 and SET2 described with reference to FIG. 8, for example, and a detailed description thereof may be omitted (e.g., not repeated).

The fifth sub-electrodes SET5 may be overlapped with the third folding axis FX3. In some embodiments, the fifth sub-electrodes SET5 may be overlapped with the third non-folding region NFA3, the third folding region FA3, and the fourth non-folding region NFA4. The fifth sub-electrodes SET5 and the first sub-electrodes SET1 may be disposed on the same layer or at the same level. The first and fifth sub-electrodes SET1 and SET5 may be disposed below (e.g., attached to or coupled to) the second electrodes ET2 in the first and third folding regions FA1 and FA3, and the second sub-electrodes SET2 may be disposed on the second electrodes ET2 in the second folding region FA2.

The first and fifth sub-electrodes SET1 and SET5 may be disposed below (e.g., attached to or coupled to) the base substrate BS, and the second sub-electrodes SET2 may be disposed on the base substrate BS. The second electrodes ET2 may be disposed on the base substrate BS in the first and third folding regions FA1 and FA3 and may be disposed below (e.g., attached to or coupled to) the base substrate BS in the second folding region FA2. The second sub-electrodes SET2 may be electrically connected to the fifth sub-electrodes SET5 through second via holes VH2, which are defined in the base substrate BS and are overlapped with the third non-folding region NFA3.

Because, in the third folding region FA3 (i.e., the out-folding region), the fifth sub-electrodes SET5 extending across the third folding axis FX3 are disposed below (e.g., attached to or coupled to) the base substrate BS, it may be possible to prevent or to reduce damage to the fifth sub-electrodes SET5.

Figure 17:
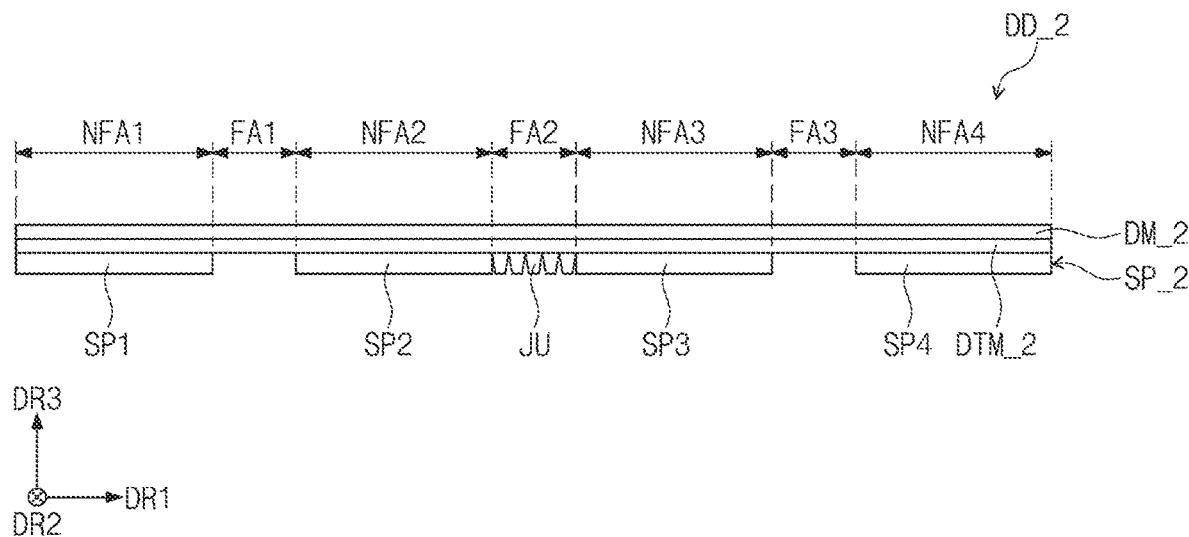
FIG. 17 is a side view schematically illustrating a display device according to some embodiments of the inventive concept.
Figure 18:
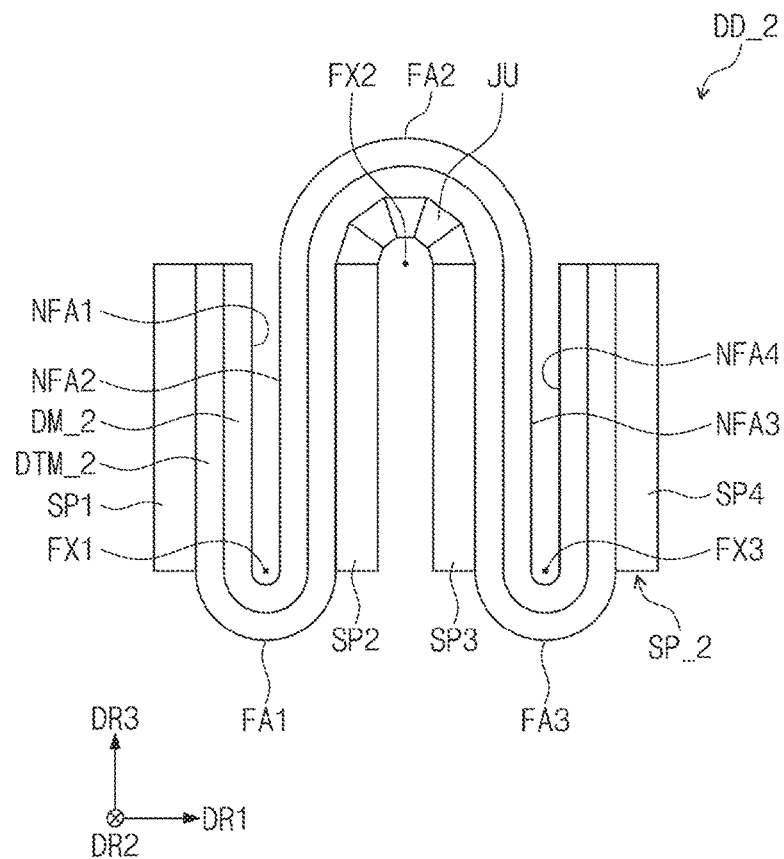
FIG. 18 is a diagram illustrating a folded state of the display device of FIG. 17.

FIG. 17 is a side view schematically illustrating a display device according to some embodiments of the inventive concept. FIG. 18 is a diagram illustrating a folded state of the display device of FIG. 17.

FIGS. 17 and 18 illustrate side views corresponding to FIGS. 13 and 14. Thus, the following description may be focused on technical features of a display device DD_2 of FIGS. 17 and 18 that are different from those technical features of the display device DD_1 of FIGS. 13 and 14. An enlarged structure of the display device DD_2 in a folded state is illustrated in FIG. 18.

Referring to FIGS. 17 and 18, the display device DD_2 may include a display module DM_2, a digitizer module DTM_2 disposed below (e.g., attached to or coupled to) the display module DM_2, and a supporting portion SP_2 disposed below (e.g., attached to or coupled to) the digitizer module DTM_2.

The display module DM_2 may include the first, second, third, and fourth non-folding regions NFA1, NFA2, NFA3, and NFA4 and the first, second, and third folding regions FA1, FA2, and FA3, similar to the display module DM_1 shown in FIG. 13.

The supporting portion SP_2 may include the first, second, third, and fourth supporting portions SP1, SP2, SP3, and SP4 and the joint units JU. The first, second, third, and fourth supporting portions SP1, SP2, SP3, and SP4 may be arranged and disposed in the same manner as the first, second, third, and fourth supporting portions SP1, SP2, SP3, and SP4 of FIG. 13. The joint units JU may be extended in the second direction DR2, may be arranged along the first direction DR1, and may be disposed between the second supporting portion SP2 and the third supporting portion SP3.

The display device DD_2 may be folded in an opposite manner to the display device DD_1. For example, the first folding region FA1 and the third folding region FA3 may be folded in an in-folding manner along the first folding axis FX1 and the third folding axis FX3, respectively, such that the first folding region FA1 and the third folding region FA3 have concave top surfaces. The second folding region FA2 may be folded in an out-folding manner along the second folding axis FX2, such that the second folding region FA2 has a convex top surface.

Figure 19:
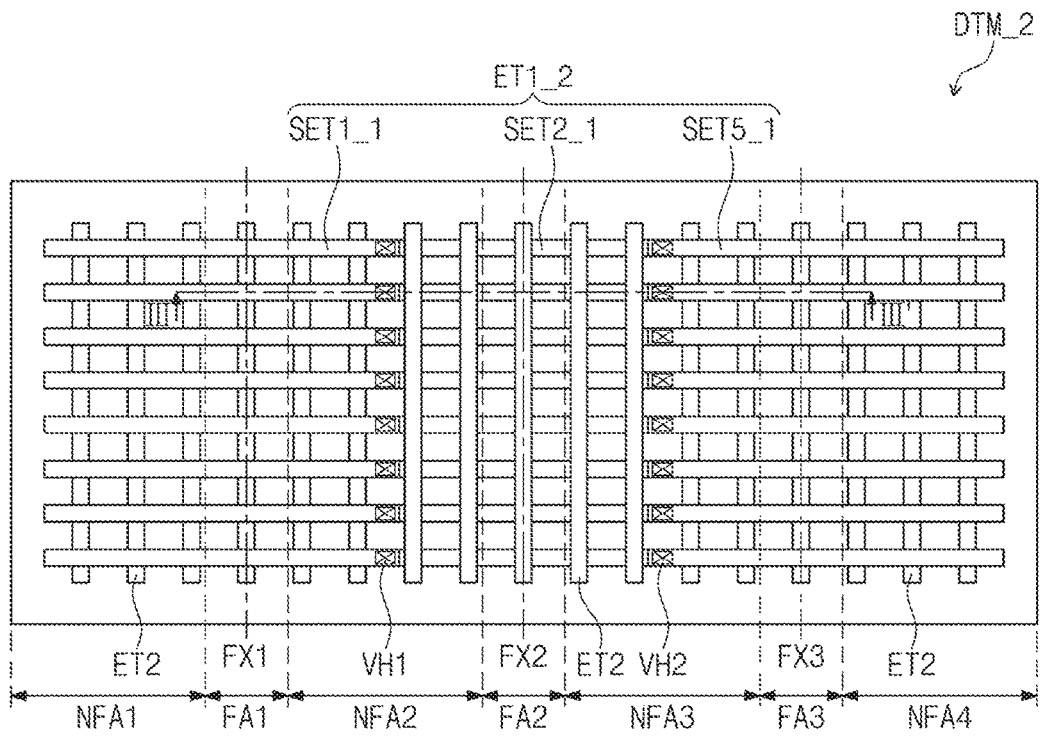
FIG. 19 is a plan view illustrating a digitizer module of FIG. 17.
Figure 19:
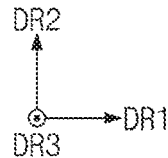
Figure 20:
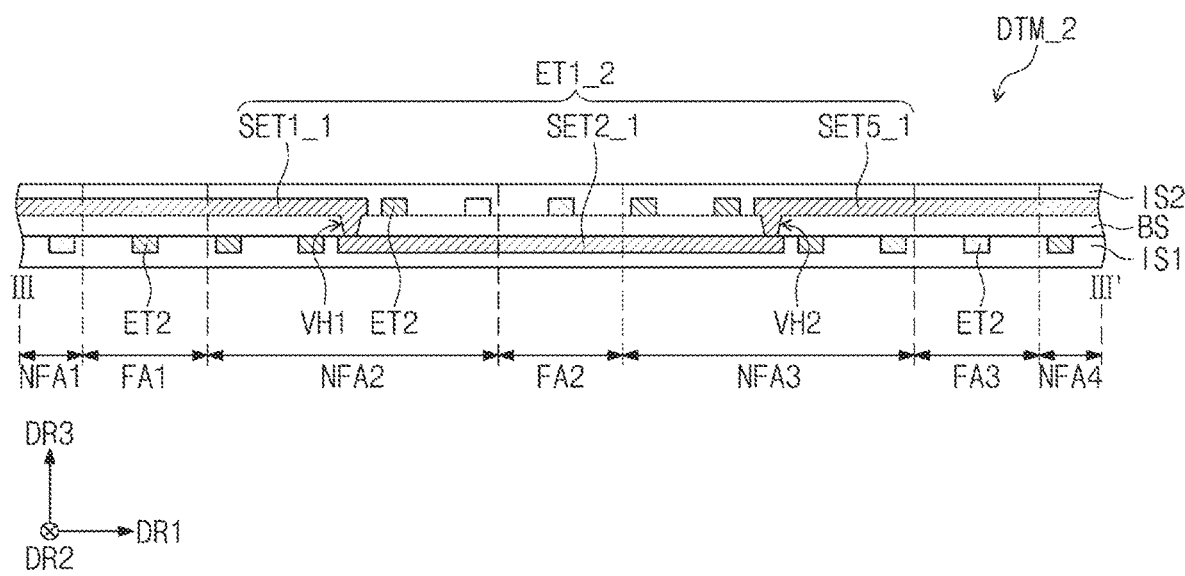
FIG. 20 is a sectional view taken along the line III-Ill' of FIG. 19.
Figure 20:
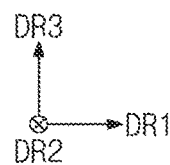

FIG. 19 is a plan view illustrating a digitizer module of FIG. 17. FIG. 20 is a sectional view taken along the line III-III' of FIG. 19.

For convenience of description, FIGS. 19 and 20 respectively illustrate plan and sectional views corresponding to FIGS. 15 and 16.

Referring to FIGS. 19 and 20, the digitizer module DTM_2 may include a plurality of first electrodes ET1_2, which are extended in the first direction DR1, and a plurality of the second electrodes ET2, which are extended in the second direction DR2. The first electrodes ET1_2 may include a plurality of first sub-electrodes SET1_1, a plurality of second sub-electrodes SET2_1, and a plurality of fifth sub-electrodes SET5_1.

The first sub-electrodes SET1_1, the second sub-electrodes SET2_1, and the fifth sub-electrodes SET5_1 may be disposed in an opposite manner to the first sub-electrodes SET1, the second sub-electrodes SET2, and the fifth sub-electrodes SET5 shown in FIGS. 15 and 16.

The first and fifth sub-electrodes SET1_1 and SET5_1 may be disposed on the second electrodes ET2 in the first and third folding regions FA1 and FA3, and the second sub-electrodes SET2_1 may be disposed below (e.g., attached to or coupled to) the second electrodes ET2 in the second folding region FA2.

The first and fifth sub-electrodes SET1_1 and SET5_1 may be disposed on the base substrate BS, and the second sub-electrodes SET2_1 may be disposed below (e.g., attached to or coupled to) the base substrate BS. The second electrodes ET2 may be disposed below (e.g., attached to or coupled to) the base substrate BS in the first and third folding regions FA1 and FA3 and may be disposed on the base substrate BS in the second folding region FA2.

The second sub-electrodes SET2_1 may be electrically connected to the first sub-electrodes SET1_1 and the fifth sub-electrodes SET5_1 through the first via holes VH1 and the second via holes VH2, which are defined in the base substrate BS.

Because, in the second folding region FA2 (i.e., the out-folding region), the second sub-electrodes SET2_1 extending across the second folding axis FX2 are disposed below (e.g., attached to or coupled to) the base substrate BS, damage to the second sub-electrodes SET2_1 may be prevented or reduced.

Figure 21:
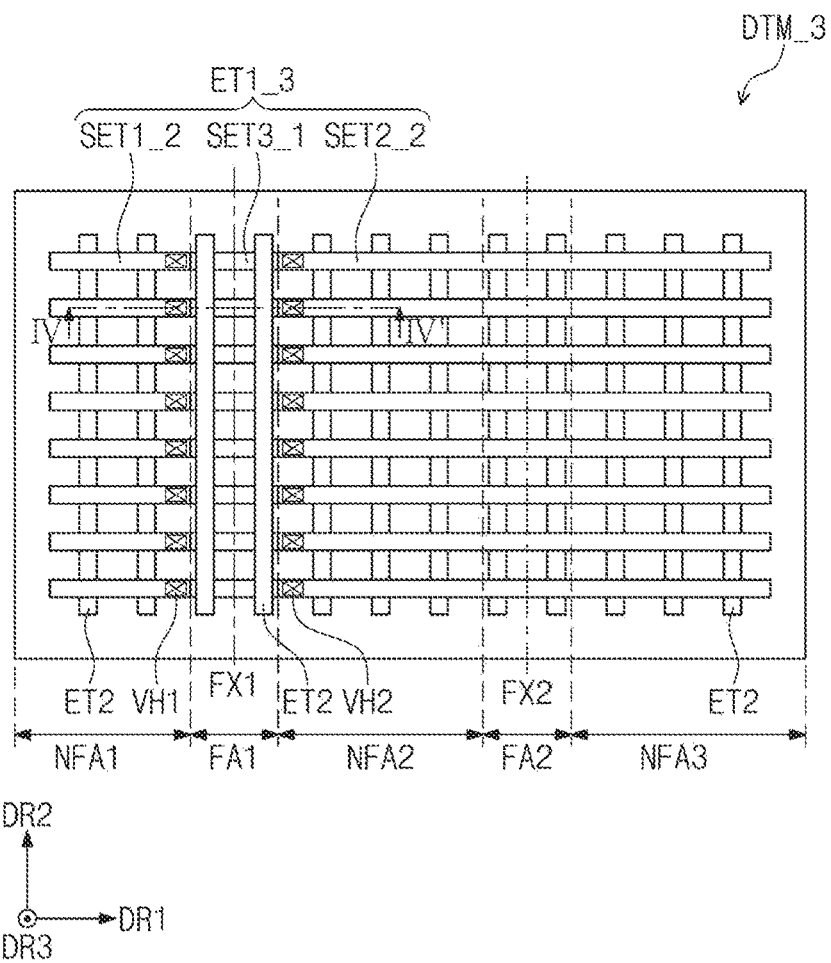
FIG. 21 is a plan view illustrating a digitizer module according to some embodiments of the inventive concept.
Figure 22:
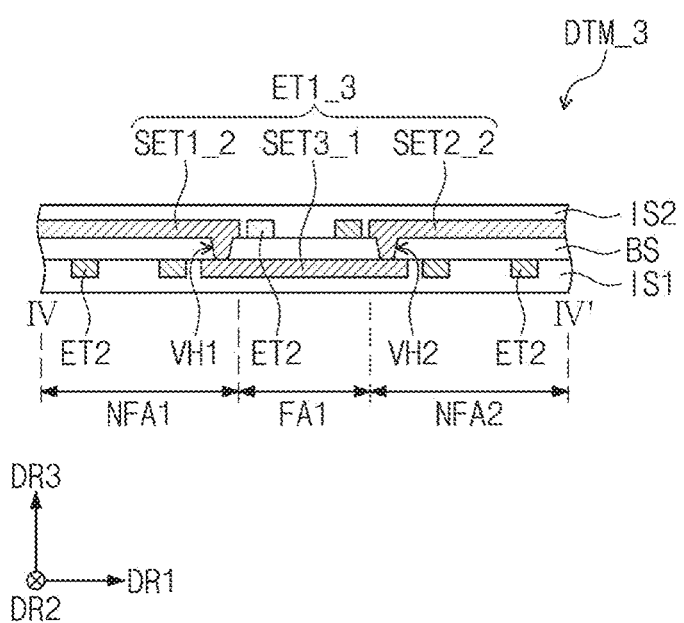
FIG. 22 is a sectional view taken along the line IV-IV' of FIG. 21.
Figure 23:
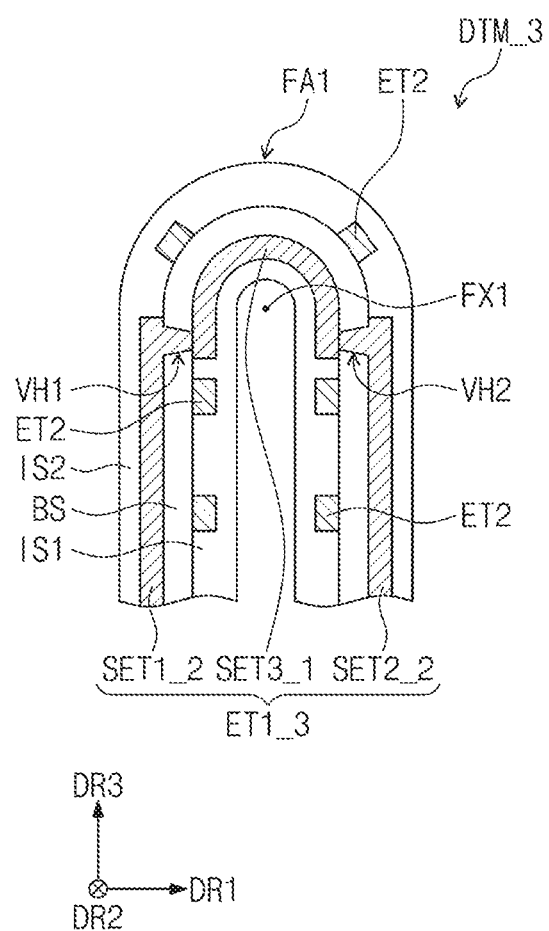
FIG. 23 is a sectional view illustrating a folded state of a digitizer module of FIG. 22.

FIG. 21 is a plan view illustrating a digitizer module according to some embodiments of the inventive concept. FIG. 22 is a sectional view taken along the line IV-IV' of FIG. 21. FIG. 23 is a sectional view illustrating a folded state of a digitizer module of FIG. 22.

For convenience in description, FIG. 21 illustrates a plan view corresponding to FIG. 8. The following description may be focused on technical features of a digitizer module DTM_3 that are different from those of the digitizer module DTM of FIG. 8.

Referring to FIGS. 21 and 22, the digitizer module DTM_3 may include a plurality of first electrodes ET1_3, which are extended in the first direction DR1, and a plurality of second electrodes ET2, which are extended in the second direction DR2.

The first electrodes ET1_3 may include a plurality of first sub-electrodes SET1_2, a plurality of second sub-electrodes SET2_2, and a plurality of third sub-electrodes SET3_1. The first sub-electrodes SET1_2 may be disposed to be overlapped with the first non-folding region NFA1. The second sub-electrodes SET2_2 may be disposed to be overlapped with the second and third non-folding regions NFA2 and NFA3 and the second folding region FA2. The second sub-electrodes SET2_2 and the first sub-electrodes SET1_2 may be disposed at (e.g., on) the same layer or at the same level.

The third sub-electrodes SET3_1 may be overlapped with the first folding axis FX1. In some embodiments, the third sub-electrodes SET3_1 may be disposed to be overlapped with the first folding region FA1 and the first and second non-folding regions NFA1 and NFA2. The third sub-electrodes SET3_1 may be disposed between the first sub-electrodes SET1_2 and the second sub-electrodes SET2_2 in a plan view. The third sub-electrodes SET3_1 may be disposed at a level (or layer) different from that of the first sub-electrodes SET1_2 and the second sub-electrodes SET2_2.

The first sub-electrodes SET1_2 and the second sub-electrodes SET2_2 may be disposed on the base substrate BS, and the third sub-electrodes SET3_1 may be disposed below (e.g., attached to or coupled to) the base substrate BS. The first sub-electrodes SET1_2 and the second sub-electrodes SET2_2 may be closer to the display module than the third sub-electrodes SET3_1 are to the display module.

The second electrodes ET2 may be disposed on the third sub-electrodes SET3_1 in the first folding region FA1, and may be disposed below (e.g., attached to or coupled to) the first and second sub-electrodes SET1_2 and SET2_2 in the other regions NFA1, NFA2, NFA3, and FA2. The second electrodes ET2 may be disposed on the base substrate BS in the first folding region FA1, and may be disposed below (e.g., attached to or coupled to) the base substrate BS in the other regions NFA1, NFA2, NFA3, and FA2.

The third sub-electrodes SET3_1 may be electrically connected to the first sub-electrodes SET1_2 through the first via holes VH1, which are defined in the base substrate BS and are overlapped with the first non-folding region NFA1. The third sub-electrodes SET3_1 may be electrically connected to the second sub-electrodes SET2_2 through the second via holes VH2, which are defined in the base substrate BS and are overlapped with the second non-folding region NFA2.

In some embodiments, a display device including the digitizer module DTM_3 may be folded in the same manner as the display device DD shown in FIG. 11. In other words, the first folding region FA1 may be folded in an out-folding manner, and the second folding region FA2 may be folded in an in-folding manner.

Referring to FIG. 23, because, in the first folding region FA1 (i.e., the out-folding region), the third sub-electrodes SET3_1 extending across the first folding axis FX1 are disposed below (e.g., attached to or coupled to) the base substrate BS, damage to the third sub-electrodes SET3_1 may be prevented or may be reduced.

According to some embodiments of the inventive concept, a digitizer module may include first electrodes, which are extended in a direction crossing folding axes, and the first electrodes of the digitizer module may be disposed below (e.g., attached to or coupled to) a base substrate in an out-folding region (e.g., a first folding region) and may be disposed on the base substrate in an in-folding region (e.g., a second folding region). Accordingly, it may be possible to prevent or to reduce damage to the first electrodes.

While example embodiments of the inventive concepts have been particularly shown and described, it will be understood by one of ordinary skill in the art that variations in form and detail may be made therein without departing from the spirit and scope of the attached claims, and equivalents thereof.

What is claimed is:

1. A display device, comprising:
  a display module that is foldable about a first folding axis and a second folding axis, the first folding axis and the second folding axis being spaced apart from each other along a first direction and extended in a second direction crossing the first direction; and
  a digitizer module below the display module,
  wherein the digitizer module comprises:
    a plurality of first electrodes extended in the first direction and arranged along the second direction; and
    a plurality of second electrodes extended in the second direction and arranged along the first direction, the second electrodes being insulated from the first electrodes,
  wherein the plurality of first electrodes comprises:
    a plurality of first sub-electrodes overlapped with the first folding axis; and a plurality of second sub-electrodes overlapped with the second folding axis, the second sub-electrodes being at a different layer from the first sub-electrodes, and wherein the first sub-electrodes are electrically connected to the second sub-electrodes.

2. The display device of claim 1, wherein the display module comprises:

first, second, and third non-folding regions arranged along the first direction;

a first folding region overlapped with the first folding axis and located between the first and second non-folding regions; and a second folding region overlapped with the second folding axis and located between the second and third non-folding regions.

3. The display device of claim 2, wherein the first sub-electrodes are overlapped with the first non-folding region, the first folding region, and the second non-folding region, and the second sub-electrodes are overlapped with the third non-folding region, the second folding region, and the second non-folding region.

4. The display device of claim 3, wherein the plurality of second electrodes comprises:

a plurality of third sub-electrodes overlapped with the first sub-electrodes; and a plurality of fourth sub-electrodes overlapped with the second sub-electrodes, the fourth sub-electrodes being at a different layer from the third sub-electrodes.

5. The display device of claim 4, wherein the first sub-electrodes are below the third sub-electrodes, and the second sub-electrodes are on the fourth sub-electrodes.

6. The display device of claim 4, wherein the digitizer module further comprises a base substrate, the first sub-electrodes are below the base substrate, and the second sub-electrodes are on the base substrate.

7. The display device of claim 6, wherein the second sub-electrodes are electrically connected to the first sub-electrodes through via holes that are defined in the base substrate and overlapped with the second non-folding region.

8. The display device of claim 6, wherein the third sub-electrodes are on the base substrate, and the fourth sub-electrodes are below the base substrate.

9. The display device of claim 2, wherein the first folding region is foldable in an out-folding manner about the first folding axis such that the first folding region has a convex top surface.

10. The display device of claim 9, further comprising:

a first supporting portion below the digitizer module and overlapped with the first non-folding region;

a second supporting portion below the digitizer module and overlapped with the second non-folding region; and a plurality of joint units below the digitizer module and overlapped with the first folding region, wherein the joint units are extended in the second direction and are arranged along the first direction.

11. The display device of claim 10, wherein, when viewed in the second direction, a width of each of the joint units decreases in a direction from a top of each of the joint units toward a bottom of each of the joint units.

12. The display device of claim 9, wherein the second folding region is foldable in an in-folding manner about the second folding axis, such that the second folding region has a concave top surface.

13. The display device of claim 12, further comprising a third supporting portion below the digitizer module, spaced apart from a second supporting portion, and overlapped with the third non-folding region.

14. The display device of claim 2, wherein the display module further comprises:

a fourth non-folding region; and a third folding region between the third non-folding region and the fourth non-folding region, the third folding region being overlapped with a third folding axis extending in the second direction, wherein the first electrodes further comprise fifth sub-electrodes overlapped with the third folding axis, and wherein the fifth sub-electrodes are at a same layer as the first sub-electrodes.

15. The display device of claim 14, wherein the first and fifth sub-electrodes are below the second electrodes, in the first and third folding regions, and the second sub-electrodes are on the second electrodes, in the second folding region.

16. The display device of claim 15, wherein the first and third folding regions are foldable in an out-folding manner about the first and third folding axes, respectively, such that the first and third folding regions have convex top surfaces, and the second folding region is foldable in an in-folding manner about the second folding axis, such that the second folding region has a concave top surface.

17. The display device of claim 15, wherein the digitizer module further comprises a base substrate, the first and fifth sub-electrodes are below the base substrate, the second sub-electrodes are on the base substrate, and the second electrodes are on the base substrate in the first and third folding regions and are below the base substrate in the second folding region.

18. The display device of claim 17, wherein the second sub-electrodes are electrically connected to the first sub-electrodes through first via holes that are defined in the base substrate and overlapped with the second non-folding region, and the second sub-electrodes are electrically connected to the fifth sub-electrodes through second via holes that are defined in the base substrate and overlapped with the third non-folding region.

19. The display device of claim 14, wherein the first and fifth sub-electrodes are on the second electrodes in the first and third folding regions, and the second sub-electrodes are below the second electrodes in the second folding region.

20. The display device of claim 19, wherein the first and third folding regions are foldable in an in-folding manner about the first and third folding axes, respectively, such that the first and third folding regions have concave top surfaces, and the second folding region is foldable in an out-folding manner about the second folding axis, such that the second folding region has a convex top surface.

21. A display device, comprising:

a display module that is foldable about a first folding axis and a second folding axis, the first folding axis and the second folding axis being spaced apart from each other along a first direction and extended in a second direction crossing the first direction; and a digitizer module below the display module, wherein the digitizer module comprises:

a plurality of first electrodes extended in the first direction; and a plurality of second electrodes extended in the second direction and electrically disconnected from the first electrodes, wherein the plurality of first electrodes comprises:

a plurality of first sub-electrodes overlapped with the first folding axis; and a plurality of second sub-electrodes overlapped with the second folding axis, wherein the second sub-electrodes are closer to the display module than the first sub-electrodes are, and wherein the first sub-electrodes are electrically connected to the second sub-electrodes.

22. The display device of claim 21, wherein the second electrodes comprise:

a plurality of third sub-electrodes overlapped with the first sub-electrodes; and a plurality of fourth sub-electrodes overlapped with the second sub-electrodes, wherein the first sub-electrodes are below the third sub-electrodes, and the second sub-electrodes are on the fourth sub-electrodes.

23. A display device comprising:

a display module that is foldable about a first folding axis and a second folding axis, the first folding axis and the second folding axis being spaced apart from each other along a first direction and are extended in a second direction crossing the first direction; and a digitizer module below the display module, wherein the digitizer module comprises:

a plurality of first electrodes extended in the first direction; and a plurality of second electrodes extended in the second direction and electrically disconnected from the first electrodes, wherein the plurality of first electrodes comprise:

a plurality of first sub-electrodes;

a plurality of second sub-electrodes at a same layer as the first sub-electrodes; and a plurality of third sub-electrodes that are overlapped with the first folding axis, are located between the first sub-electrodes and the second sub-electrodes, and are at a different layer from the first sub-electrodes, and wherein the first sub-electrodes are electrically connected to the third sub-electrodes.

24. The display device of claim 23, wherein the first and second sub-electrodes are closer to the display module than the third sub-electrodes are.

* * * * *